United States Patent
Chung et al.

(10) Patent No.: US 8,201,046 B2
(45) Date of Patent: Jun. 12, 2012

(54) METHOD OF ENCODING/DECODING USING LOW DENSITY CHECK CODE MATRIX

(75) Inventors: Ji Wook Chung, Gyeonggi-do (KR); Min Seok Oh, Gyeonggi-do (KR); Ki Hyoung Cho, Gyeonggi-do (KR); Ji Ae Seok, Gyeonggi-do (KR); Young Seob Lee, Gyeonggi-do (KR); So Yeon Kim, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 467 days.

(21) Appl. No.: 12/373,726

(22) PCT Filed: Jul. 13, 2007

(86) PCT No.: PCT/KR2007/003416
§ 371 (c)(1),
(2), (4) Date: Nov. 25, 2009

(87) PCT Pub. No.: WO2008/007927
PCT Pub. Date: Jan. 17, 2008

(65) Prior Publication Data
US 2010/0115359 A1   May 6, 2010

(30) Foreign Application Priority Data

Jul. 14, 2006 (KR) .................. 10-2006-0066465

(51) Int. Cl.
*H03M 13/00* (2006.01)
(52) U.S. Cl. ........................ 714/752; 714/801
(58) Field of Classification Search .................. 714/752, 714/801
See application file for complete search history.

(56) References Cited

U.S. PATENT DOCUMENTS

| | | | | |
|---|---|---|---|---|
| 6,895,547 B2* | 5/2005 | Eleftheriou et al. | .......... | 714/801 |
| 7,313,752 B2* | 12/2007 | Kyung et al. | .................. | 714/801 |
| 7,934,140 B2* | 4/2011 | Oh et al. | ........................ | 714/752 |
| 2004/0148560 A1* | 7/2004 | Hocevar | ........................ | 714/801 |
| 2004/0199860 A1* | 10/2004 | Kim et al. | ..................... | 714/801 |
| 2005/0166133 A1* | 7/2005 | Eroz et al. | ..................... | 714/801 |

(Continued)

FOREIGN PATENT DOCUMENTS

EP    1385270    1/2004

(Continued)

OTHER PUBLICATIONS

Anonymous, "IEEE Standard for Local and Metropolitan Area Networks Part 16: Air Interface for Fixed and Mobile Broadband Wireless Access Systems Amendment 2: Physical and Medium Access Control Layers for Combined Fixed and Mobile Operation in Licensed Bands and Corrigendum 1," Amendment 2 and Corrigendum 1 to IEEE Standard 802.16-2004, XP-002535900.
Anonymous, "Matrix Algebra—1. Vectors and Matrices," Feb. 2006, XP-002592166.
T. J. Richardson et al., "Efficient Encoding of Low-Density Parity-Check Codes," IEEE Transactions on Information Theory, vol. 47, No. 2, Feb. 2001, XP-002965294.

(Continued)

*Primary Examiner* — Yolanda L Wilson
(74) *Attorney, Agent, or Firm* — Lee, Hong, Degerman, Kang & Waimey

(57) ABSTRACT

A method of encoding data using a parity check matrix is disclosed. The method of encoding data using a parity check matrix includes receiving information bit streams, and encoding the information bit streams using the parity check matrix which includes a systematic part and a parity part having a lower triangle type.

16 Claims, 43 Drawing Sheets

U.S. PATENT DOCUMENTS

| | | | |
|---|---|---|---|
| 2005/0289437 A1* | 12/2005 | Oh et al. | 714/758 |
| 2006/0123314 A1 | 6/2006 | Kim et al. | |
| 2006/0279437 A1* | 12/2006 | Luby et al. | 341/50 |
| 2008/0104474 A1* | 5/2008 | Gao et al. | 714/752 |
| 2009/0228771 A1* | 9/2009 | Shasha | 714/801 |
| 2010/0115359 A1* | 5/2010 | Chung et al. | 714/748 |
| 2010/0122140 A1* | 5/2010 | Shen et al. | 714/752 |

FOREIGN PATENT DOCUMENTS

| | | |
|---|---|---|
| EP | 1511177 | 3/2005 |
| EP | 1589664 | 10/2005 |
| WO | 2005036758 | 4/2005 |
| WO | 2006-039801 | 4/2006 |

OTHER PUBLICATIONS

M. Yazdani et al., "On Construction of Rate-Compatible Low-Density Parity-Check Codes," IEEE Communications Society, Jun. 2004, XP-010710382.

H. Wen et al., "On the Performance of Incremental Redundancy Hybrid ARQ Schemes with Rate Compatible LDPC Codes," Jun. 2006, XP-031010535.

Wikipedia Contributors, "Tridiagonal matrix," Wikipedia, The Free Encyclopedia, Jul. 12, 2006, http://en.wikipedia.org/w/index.php?title=Tridiagonal_matrix&oldid=63429656 (accessed Mar. 25, 2011).

* cited by examiner

FIG. 5
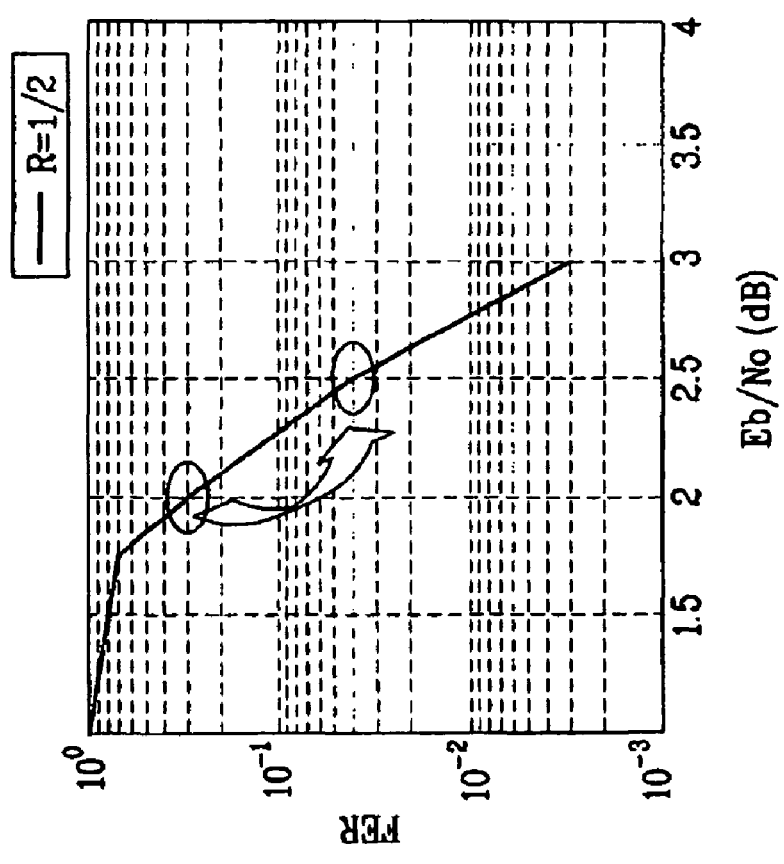
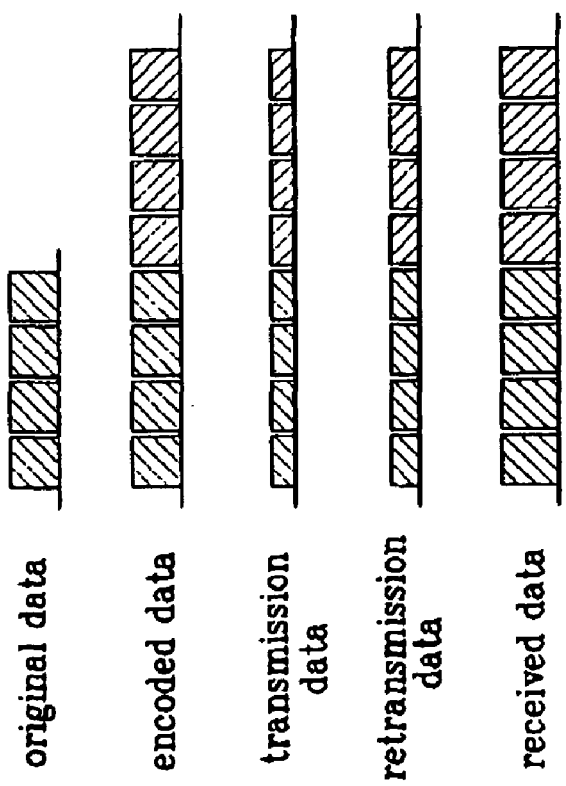

FIG. 7

$$H = \begin{bmatrix} P^{h^b_{00}} & P^{h^b_{01}} & P^{h^b_{02}} & \cdots & P^{h^b_{0n_b}} \\ P^{h^b_{10}} & P^{h^b_{11}} & P^{h^b_{12}} & \cdots & P^{h^b_{1n_b}} \\ \cdots & \cdots & \cdots & \cdots & \cdots \\ P^{h^b_{m_b 0}} & P^{h^b_{m_b 1}} & P^{h^b_{m_b 2}} & \cdots & P^{h^b_{m_b n_b}} \end{bmatrix} = P^{H_b}$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix} \xrightarrow{\text{3 right shift}} \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

Accumulator Structure

| 0 | 1 | 0 | 1 | 1 | 0 | 0 | 0 |
|---|---|---|---|---|---|---|---|
| 1 | 0 | 1 | 0 | 1 | 1 | 0 | 0 |
| 0 | 1 | 0 | 0 | 0 | 1 | 1 | 0 |
| 1 | 0 | 1 | 1 | 0 | 0 | 1 | 1 |

Parity Check Matrix H

×

| a0 |
|----|
| a1 |
| a2 |
| a3 |
| p0 |
| p1 |
| p2 |
| p3 | codeword c

=

| 0 |
|---|
| 0 |
| 0 |
| 0 |

$a_1 \oplus a_3 \oplus p_0 = 0$  $\quad\quad p_0 = a_1 \oplus a_3$ $a_0 \oplus a_2 \oplus p_0 \oplus p_1 = 0$  $\quad\quad p_1 = a_0 \oplus a_2 \oplus p_0$ $a_1 \oplus p_1 \oplus p_2 = 0$  $\quad\quad p_2 = a_1 \oplus p_1$ $a_0 \oplus a_2 \oplus a_3 \oplus p_2 \oplus p_3 = 0$  $\quad\quad p_3 = a_0 \oplus a_2 \oplus a_3 \oplus p_2$

FIG. 18

$$H = \begin{bmatrix} P_{0,0} & P_{0,1} & P_{0,2} & \cdots & P_{0,n_b-2} & P_{0,n_b-1} \\ P_{1,0} & P_{1,1} & P_{1,2} & \cdots & P_{1,n_b-2} & P_{1,n_b-1} \\ P_{2,0} & P_{2,1} & P_{2,2} & \cdots & P_{2,n_b-2} & P_{2,n_b-1} \\ \cdots & \cdots & \cdots & \cdots & \cdots & \cdots \\ P_{m_b-1,0} & P_{m_b-1,1} & P_{m_b-1,2} & \cdots & P_{m_b-1,n_b-2} & P_{m_b-1,n_b-1} \end{bmatrix} = P^{H_b}$$

METHOD OF ENCODING/DECODING USING LOW DENSITY CHECK CODE MATRIX

CROSS-REFERENCE TO RELATED APPLICATIONS

This application is the National Stage filing under 35 U.S.C. §371 of International Application No. PCT/KR2007/003416, filed on Jul. 13, 2007, which claims the benefit of earlier filing date and right to priority to Korean Application No. 10-2006-0066465, filed on Jul. 14, 2006.

TECHNICAL FIELD

The present invention relates to a method of encoding/decoding using a low density parity check (LDPC) code, and more particularly, to a method of encoding data using a parity check matrix.

BACKGROUND ART

FIG. 1 illustrates a structure of a mobile communication channel to which the present invention and the related art are applied. Hereinafter, the structure of the mobile communication channel will be described with reference to FIG. 1. A transmitter undergoes a channel coding procedure to transmit data without loss or distortion through a radio channel. Examples of the channel coding include convolutional coding, turbo coding, LDPC coding, etc. The data which has undergone the channel coding procedure can be transmitted to the radio channel as a single symbol which includes several bits. At this time, a procedure of mapping several bits to a single symbol is referred to as modulation.

The modulated data is converted into a signal for multiple transmission through a multiplexing procedure or a multiple access method. Examples of the multiplexing procedure include CDM, TDM, FDM, etc. An example of OFDM (Orthogonal Frequency Division Multiplexing) is shown in FIG. 1. The signal which has undergone the multiplexing block is changed to a structure suitable for transmission to one or more multi-antennas, and then is transferred to a receiver through the radio channel. Fading and thermal noise occur in the transmitted data when the data passes through the radio channel. For this reason, distortion may occur in the data.

The modulated data is transferred to the receiver through the radio channel. In this case, fading and thermal noise occur in the transmitted data, whereby distortion may occur therein. The receiver performs a series of procedures of the transmitter in reverse order after receiving the distorted data. The receiver performs demodulation to convert the data mapped to the symbol into a bit stream, undergoes channel decoding, and restores the distorted data to the original data.

An apparatus of performing the channel coding stores a matrix H or a matrix G, wherein the matrix H is a parity check matrix used to generate parity bits to be added to input data (systematic bits), and the matrix G is a parity check generate matrix derived from the matrix H. In other words, the transmitter includes an encoder which generates parity bits through the input data and the matrix H or G. An apparatus of performing channel decoding checks whether the systematic bits are restored well, through operation of the received data (distorted systematic bits+parity bits) with the matrix H, and performs operation again if the systematic bits are failed to be restored.

Examples of the modulation include BPSK (Binary Phase Shift Keying), QPSK (Quadrature Phase Shift Keying), 16-QAM (Quadrature Amplitude Modulation), 64-QAM, 256-QAM, etc. For example, 16-QAM maps the data stream which has undergone channel encoding during modulation to a single symbol in a unit of 4 bits. 16-QAM de-maps the single symbol received through the radio channel during demodulation to four bits.

Hereinafter, a data retransmission method that can be used along with the present invention will be described. There are provided various examples of the data retransmission method. Of them, HARQ (Hybrid Automatic Repeat reQuest) method will be described. The HARQ method is obtained by combination of FEC (Forward Error Correction) symbol and ARQ (Automatic Repeat reQuest) which is a retransmission method in a mobile communication system. According to the ARQ method, if error is detected from data received by the receiver, the receiver requests retransmission to a transmitter. Examples of the ARQ method include Stop-And-Wait, Selective Repeat, Go-Back-N, etc. depending on the retransmission method. According to the Stop-And-Wait method, as shown in FIG. 2, if the transmitter receives an acknowledgement (ACK) message from the receiver after transmitting data, the transmitter transmits next data, wherein the ACK message notifies that the receiver has successfully received the data. If the transmitter receives a NACK message from the receiver, wherein the NACK message notifies that the receiver has failed to successfully receive the data, the transmitter retransmits the failed data.

Meanwhile, according to the Go-Back-N method, the transmitter first transmits N number of data and receives ACK messages from the receiver in due order. FIG. 3 illustrates a case of N=7, wherein the number N of data which are transmitted without ACK message is referred to as a window size. If the transmitter receives the NACK message in response to the $k^{th}$ data, the transmitter sequentially transmits data starting from the $k^{th}$ data.

FIG. 4 illustrates a Selective Repeat method. According to the Selective Repeat method, like the Go-Back-N method, the number N of data which are transmitted without ACK or NACK message is referred to as a window size, and retransmission is selectively performed for only data with NACK message.

According to the aforementioned HARQ method, if retransmission is performed in the ARQ method, previously transmitted data is combined with retransmitted data to restore the data through FEC symbol. The HARQ method is classified into a chase combining method and an incremental redundancy method depending, on a combining method of the two data. According to the chase combining method, as shown in FIG. 5, the receiver combines transmission data with retransmission data to increase a receiving signal to noise ratio (SNR), thereby increasing a receiving success ratio of data at the receiver.

Meanwhile, unlike the chase combining method, the incremental redundancy method (hereinafter, referred to as 'IR method') transmits some of encoded data, which have not been used for first transmission, during retransmission of the transmitter to decrease a coding rate of data received at the receiver, thereby increasing a receiving success ratio.

Hereinafter, LDPC coding will be described. A concept of LDPC coding is as follows.

A linear code can be described with the parity check generation matrix G and the parity check matrix H. A characteristic of the linear code is that the equation of $Hc^T=0$ is satisfied for every bit of a codeword 'c'. As one of the linear code, the LDPC code which was recently paid attention to was proposed by Gallager in 1962 for the first time. One of the characteristics of the LDPC coding is that most of elements of the parity check matrix H are '0' and the number of elements which are not '0' is small compared to the codeword, so that repetitive decoding based on probability is possible. A parity check matrix H for the first proposed LDPC code was defined in a non-systematic form and each row and column of the parity check matrix were designed to equally have a small weight.

In this case, the weight means the number of '1' included in each row and column.

The LDPC coding scheme has low decoding complexity since a density of elements which are not '0' in the parity check matrix H is low. Further, decoding performance of the LDPC coding is superior to other coding schemes, which is adjacent to the theoretical limit of Shannon. However, the LDPC coding scheme could not be implemented with the hardware technique at the time of proposal by Gallegar, so that the LDPC coding scheme has not been paid attention to by the people for 30 years. A repetitive decoding scheme using graphs was developed in early 1980's and a couple of decoding algorithms for the LDPC code have been developed using the repetitive decoding scheme. One of them is a sum-product algorithm.

Hereinafter, the characteristic of the LDPC coding will be described. The LDPC coding has a superior error correction capability, thereby improving communication speed and capacity. When combined with a multi-input and multi-output (MIMO) scheme, the LDPC coding can be applied to a high speed wireless LAN having a data transmission speed of several hundred Mbit/s, a high speed mobile communication system having a data transmission speed of one Mbit/s for a user moving at a speed of 250 km/h, and an optical communication system having a data transmission speed of 40 Gbit/s. In addition, the LDPC coding can enable a quantum encryption communication diminishing the number of retransmission on a communication path having low quality since transmission quality is improved due to its high error correction capability. Further, data packets having errors can be easily recovered due to the low complexity and superior loss compensation capability of the LDPC coding, so that contents having quality equal to that of TV can be transmitted through the Internet and the mobile communication system. 10G BASE-T transmission within a range of 100m which has been considered impossible earlier can be realized owing to wide application range and large capacity which are advantages of the LDPC coding. In addition, transmission capacity of a single satellite transmitter having 36 MHz bandwidth can be increased up to 80 Mbit/s which is 1.3 times of usual transmission capacity. With the above described advantages, the LDPC coding scheme is adopted as a next generation channel coding scheme in a communication system, like IEEE 802.16 or IEEE 802.11, etc.

Hereinafter, a structured LDPC will be described.

A parity check matrix H is used to use LDPC code, and includes most of elements 0 and some elements 1. Since the matrix H has a great size of $10^5$ bits or greater, a large sized memory is required to express the matrix H. The structured LDPC expresses the elements of the matrix H used for LDPC encoding and decoding as a sub-block of a certain size as shown in FIG. 7. In IEEE 802.16e, the sub-block is identified by one integer index to decrease the size of the memory required to store the matrix H. Various kinds of matrixes could be the sub-block. For example, a permutation matrix of a certain size could be the sub-block.

If the structured LDPC is used, one integer (i.e., index) is only needed to be stored in a specific memory instead of a certain sized matrix consisting of elements of 1 or 0. Accordingly, the size of the memory required to express the matrix H can be decreased.

For example, if a size of a codeword reflected in the IEEE802.16e standard is 2304 and a coding rate is ⅔, a model matrix used for LDPC encoding/decoding is as shown in FIG. 8.

As shown in FIG. 8, the structured LDPC matrix of IEEE802.16e consists of elements of −1, 0 and positive integers, wherein −1 represents a zero matrix of which elements are all 0, and 0 represents an identity matrix. The positive integers excluding −1 and 0 constitute a permutation matrix in which the identity matrix is shifted to the right by positive integers. In other words, if elements constituting a matrix are 3, it represents a permutation matrix in which the identity matrix is shifted to the right three times.

Figures 7, 8, 9:
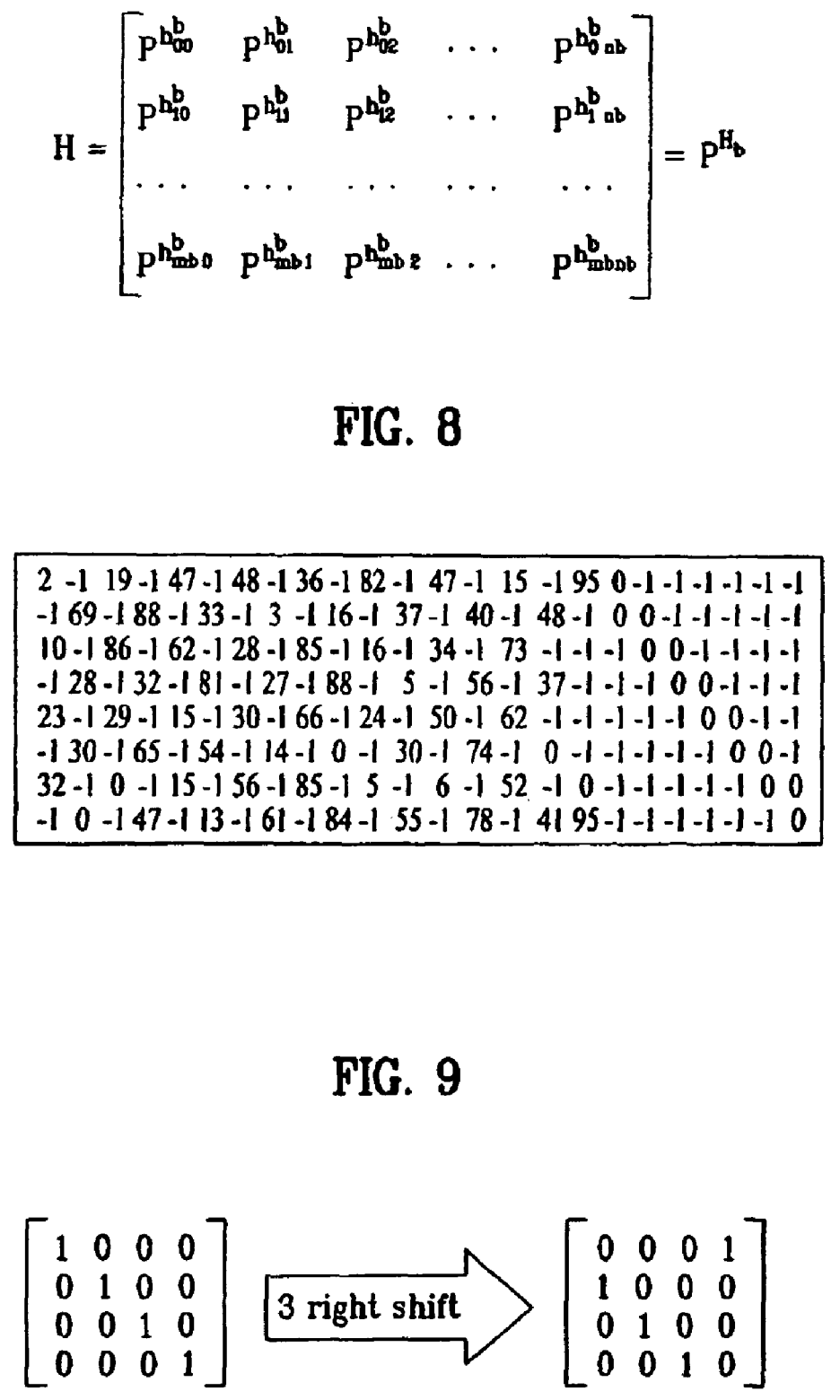

FIG. 9 illustrates a method of expressing a matrix according to the aforementioned positive integers, i.e., shift numbers. It is assumed that a specific matrix H is identified by a structured matrix of 4×4 (i.e., sub-block). In this case, if the specific sub block is identified by 3, the sub-block becomes a matrix of FIG. 9. 0

Hereinafter, LDPC encoding method will be described.

According to a general LDPC encoding method, information bits are encoded by using a generation matrix G derived from an LDPC parity check matrix H. To derive the generation matrix G, the parity check matrix H is configured in the form of $[P^T:I]$ by using a Gaussian reduction method. Assuming that the number of the information bits is 'k' and a size of an encoded codeword is 'n', the 'P' is a matrix having 'k' number of rows and '(n−k)' number of columns and the 'I' is an identity matrix having 'k' number of rows and columns.

When the parity check matrix H is represented in the form of $[P^T:I]$, the generation matrix G has the form of $[I:P]$. The information bits of k bits to be encoded can be represented as a matrix 'x' having one row and 'k' number of columns. In this case, the codeword 'c' is represented in the form of the following equation.

$$c = xG = [x:xP] \quad \text{[Equation 1]}$$

In the above equation, x represents a systematic part, and xP represents a parity part.

Meanwhile, if encoding is performed by the Gaussian Reduction method as above, since a calculation amount is increased, the form of the matrix H is designed in a specific structure so that a method of directly encoding data in the matrix H without deriving the matrix G is used. In other words, if the equation 1 is multiplied by $H^T$ by using a feature (i.e., $GH^T = 0$) that a product between the matrix G and a transpose $H^T$ for the matrix H, the following equation 2 can be obtained. The codeword 'c' can be obtained by adding a parity bit suitable for the equation 2 next to the information bit 'x.'

$$cH^T = xGH^T = [x:xP][P^T:I]^T = 0 \quad \text{[Equation 2]}$$

Hereinafter, LDPC decoding method will be described.

Data encoded in a communication system includes noise when passing through a radio channel of FIG. 1. A receiver represents a decoding procedure of data through a procedure as shown in FIG. 10. A decoding block of the receiver obtains an information bit 'x' from a receiving signal c' having the encoded codeword 'c' added with noise by using the feature of $cH^T = 0$. In other words, assuming that the received codeword is c', a value of $c'H^T$ is calculated. As a result, if the value of $c'H^T$ is 0, first k number of bits from c' are determined as the information bit x. If the value of $c'H^T$ is not 0, c' which satisfies $c'H^T$ of 0 is searched by using a decoding method of a sum-product algorithm through a graph, thereby restoring the information bit x.

Hereinafter, a coding rate of LDPC coding will be described.

Generally, when the size of the information bit is k and the size of the codeword which is actually transmitted is n, a coding rate (R) is as follows.

$$R=k/n \qquad \text{[Equation 3]}$$

When the matrix H necessary for LDPC encoding and decoding has a row size of m and a column size of n, a coding rate is as follows.

$$R=1-m/n \qquad \text{[Equation 4]}$$

As described above, since the related art LDPC code is encoded and decoded by the matrix H, the structure of the matrix H is very important. In other words, since encoding and decoding performance is greatly affected by the structure of the matrix H, design of the matrix H is more important than anything else.

The related art LDPC code has a problem in performing retransmission in accordance with the IR method. Although the IR method is a retransmission method which uses the correlation between the previously transmitted parity part and the retransmitted parity part, the correlation between the previously transmitted parity part and the retransmitted parity part does not exist if encoding is performed using the related art LDPC code. Accordingly, to apply the related art LDPC code to the IR method, modification of the related art LDPC code is needed.

DISCLOSURE OF THE INVENTION

Accordingly, the present invention is suggested to substantially obviate one or more problems due to limitations and disadvantages of the related art. An object of the present invention is to provide a method of encoding data by LDPC code which is applicable to various retransmission methods.

Another object of the present invention is to provide a method of encoding data by LDPC code, which has improved performance.

Other object of the present invention is to provide a method of encoding data by LDPC code, in which error floors do not occur during decoding.

To achieve these objects and other advantages and in accordance with the purpose of the invention, as embodied and broadly described herein, a method of encoding data using a parity check matrix includes receiving information bit streams, and encoding the information bit streams using the parity check matrix which includes a systematic part and a parity part having a lower triangle type.

In another aspect of the present invention, a method of encoding data using a parity check matrix includes encoding a first input data stream using a first sub-matrix of a parity check matrix including at least two sub-matrixes, and encoding a second input data stream using a second sub-matrix of the parity check matrix, wherein a first sub-parity part of the first sub-matrix and a second sub-parity part of the second sub-matrix have a dual diagonal structure, and each column weight of the first sub-parity part and the second sub-parity part is greater than at least 2.

In still another aspect of the present invention, a data retransmission method in a mobile communication system includes transmitting a first data packet encoded by a first sub-matrix of a parity check matrix to a receiving side, the parity check matrix including at least two sub-matrixes, receiving a retransmission request message for the first data packet from the receiving side, and transmitting a second data packet encoded by a second sub-matrix of the parity check matrix to the receiving side, wherein a first sub-parity part of the first sub-matrix and a second sub-parity part of the second sub-matrix have a dual diagonal structure, and each column weight of the first sub-parity part and the second sub-parity part is greater than at least 2.

In further still another aspect of the present invention, a method of encoding data using a parity check matrix includes encoding a first input data stream using a first sub-matrix of a parity check matrix including at least two sub-matrixes, and encoding a second input data stream using a second sub-matrix of the parity check matrix, wherein a first sub-parity part of the first sub-matrix and a second sub-parity part of the second sub-matrix have a dual diagonal structure.

BRIEF DESCRIPTION OF THE DRAWINGS

FIG. 5 and FIG. 6 illustrate a retransmission method according to the related art and the present invention;

FIG. 7 illustrates a concept of a sub-block on a parity check matrix;

FIG. 8 is an example of a model matrix suggested in the related art;

FIG. 9 illustrates a method of configuring a sub-block depending on shift numbers;

FIG. 15A to FIG. 15J illustrate examples of model matrixes which include dual diagonal elements of a lower triangle type according to the embodiment of the present invention;

FIG. 16 illustrates a procedure of performing encoding using a parity check matrix of a lower triangle type according to the embodiment of the present invention;

FIG. 18 illustrates an example of a model matrix which includes various sub-blocks $P_{i,j}$ in accordance with the embodiment of the present invention;

BEST MODE FOR CARRYING OUT THE INVENTION

Hereinafter, structures, operations, and advantages of the present invention will be understood readily by the preferred embodiments of the present invention, examples of which are illustrated in the accompanying drawings.

A matrix which represents a parity check matrix by using a sub-block of a specific size of z×z depending on the aforementioned structured LDPC will be referred to as a model matrix. The model matrix can be expanded to various kinds of models by a specific index. In other words, the model matrix uses an index as its element, and can be expanded to a parity check matrix by substituting a permutation matrix for each index. Each sub-block of the model matrix can be determined by various methods depending on the index. Hereinafter, it is assumed that the index is a shift number of an identity matrix of a specific size (z×z). In other words, each sub-block is generated by shifting each row or column of a base matrix (for example, identity matrix) of z×z dimension in a certain direction. Each sub-block can be identified by the shifted number of each row or column. A method of generating each sub-block from the base matrix is not limited to shift of row or column. A sub-block having an index of '−1' is a zero matrix of a specific size (z×z). The index '−1' which represents a zero matrix in a model matrix will be omitted as far as reference is not specially made thereto. However, it is not intended that, even though there is no index for a specific sub-block of a model matrix, the corresponding sub-block means a zero matrix.

The model matrix can be expanded to a specific parity check matrix depending on indexes. In other words, each index of the model matrix can be replaced with a sub-block depending on rules indicated by each index to generate a parity check matrix. In other words, performing encoding and decoding by using the model matrix means that encoding and decoding are performed by a specific parity check matrix generated by the model matrix.

Figure 1:
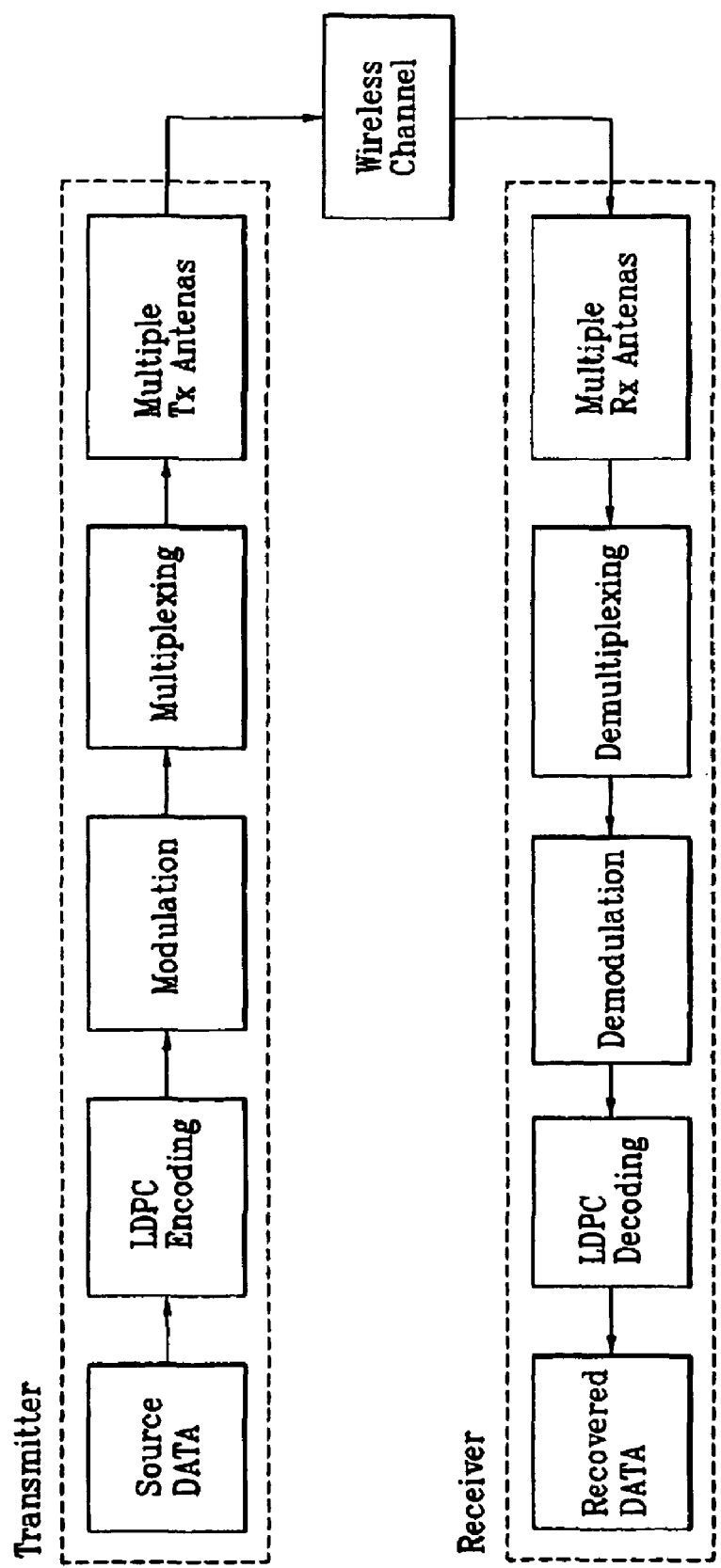
FIG. 1 illustrates a structure of a mobile communication channel to which the present invention and the related art are applied.
Figure 2:
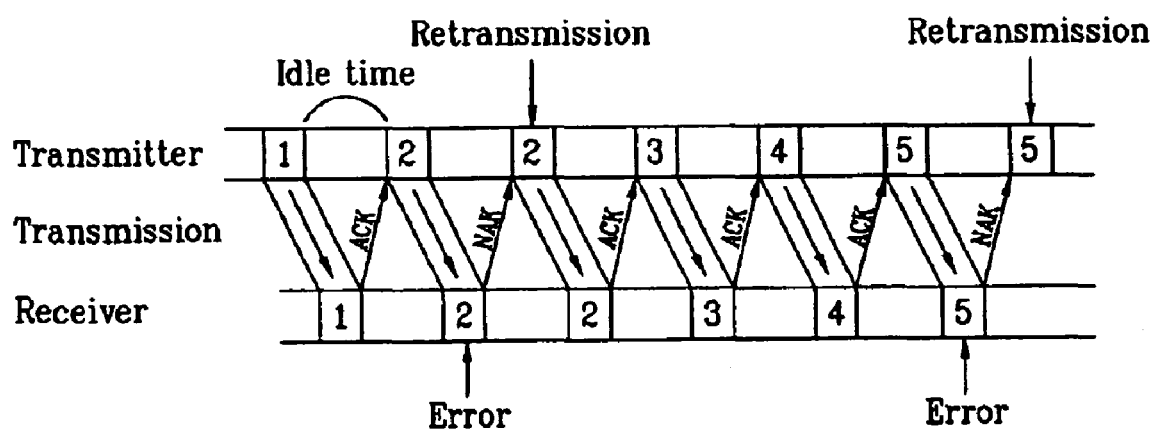
FIG. 2 to FIG. 4 illustrate a retransmission method according to the related art.
Figure 3:
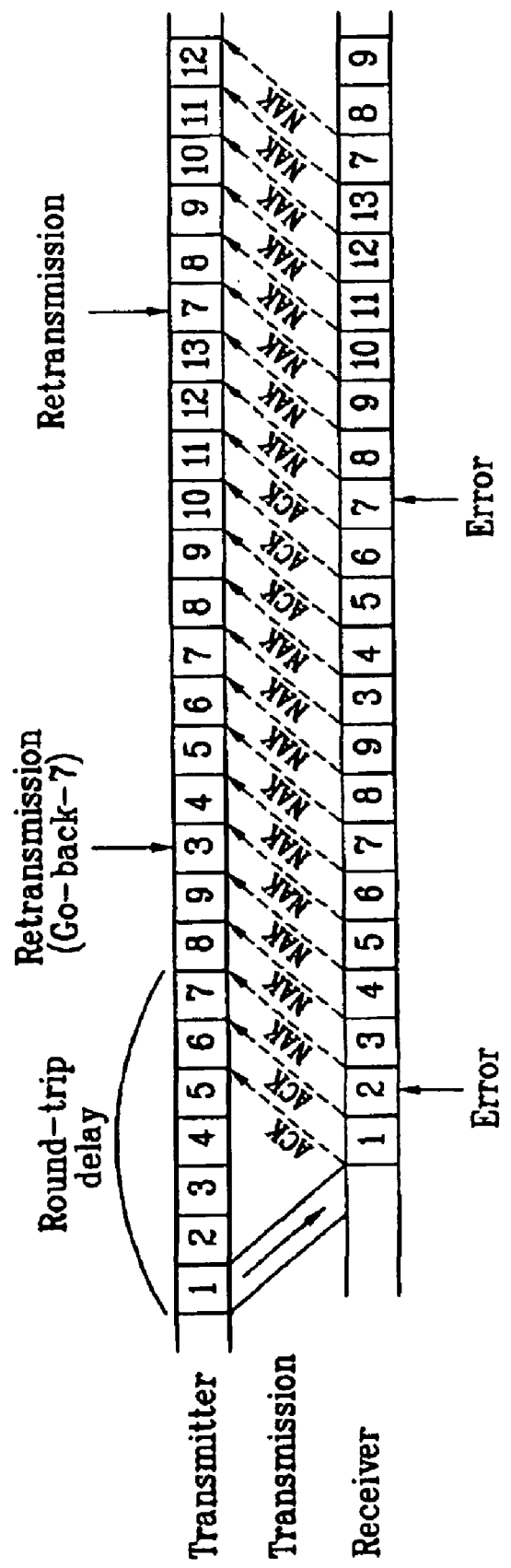
Figure 4:
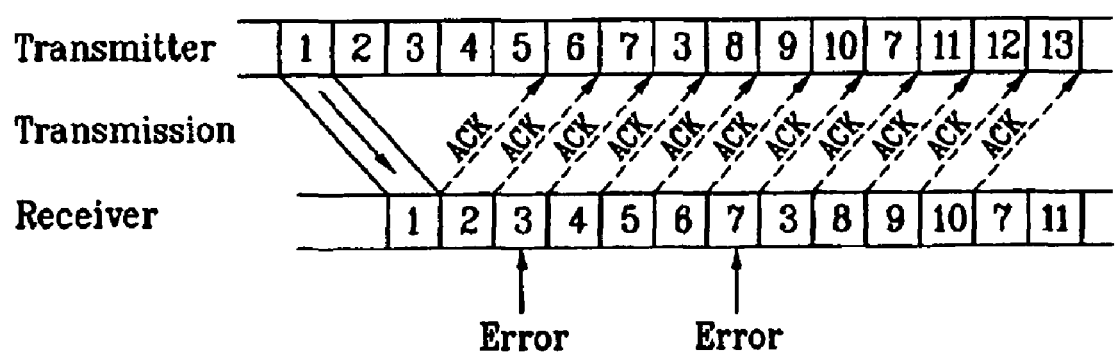
Figure 6:
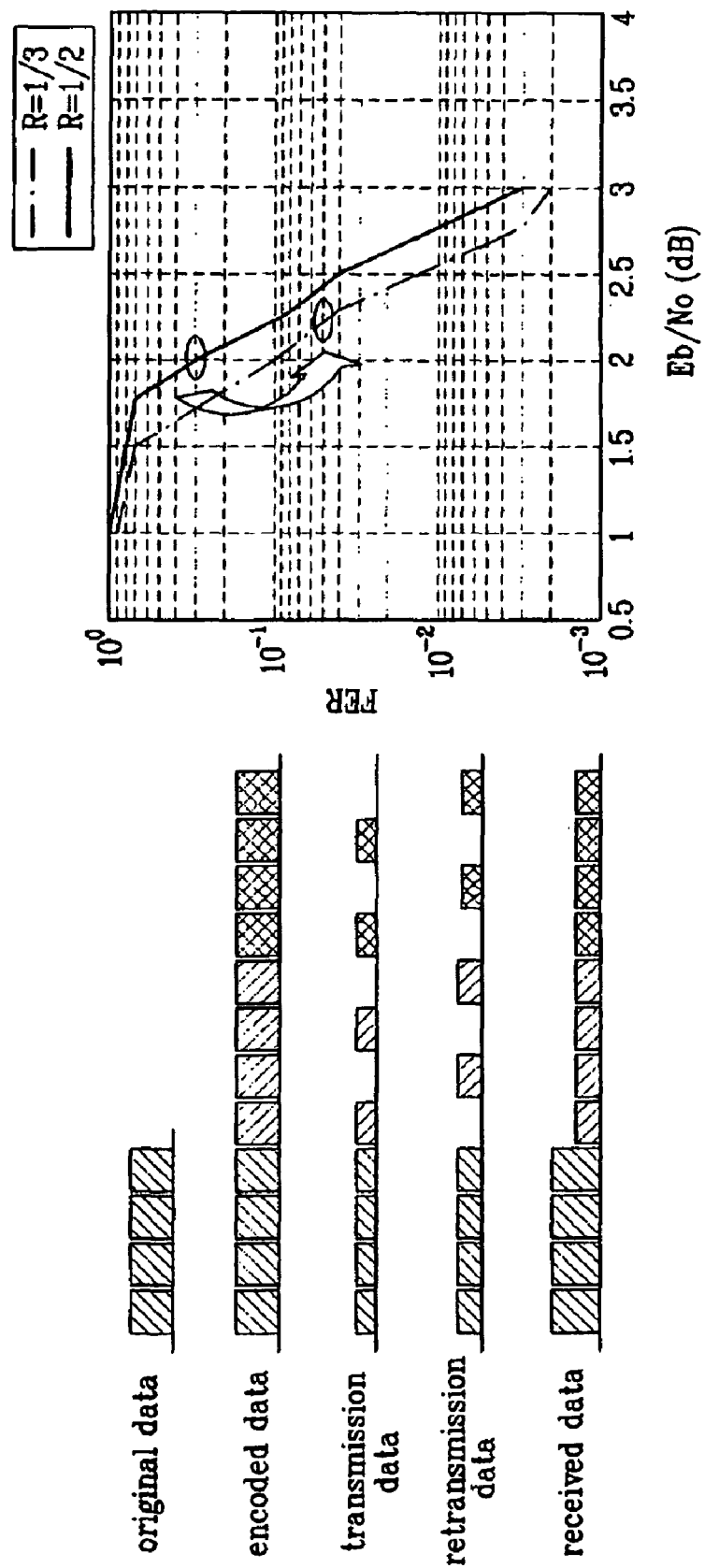
Figure 10:
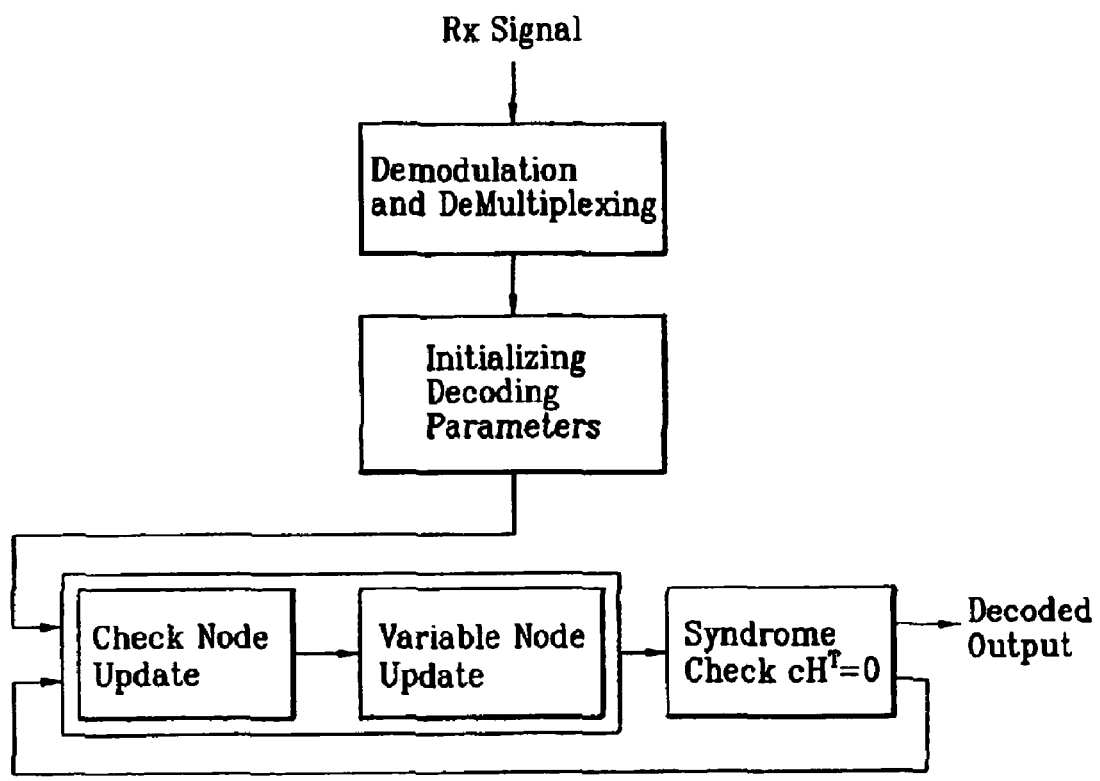
FIG. 10 illustrates a method of decoding data using LDPC according to the related art and the present invention.
Figure 11:
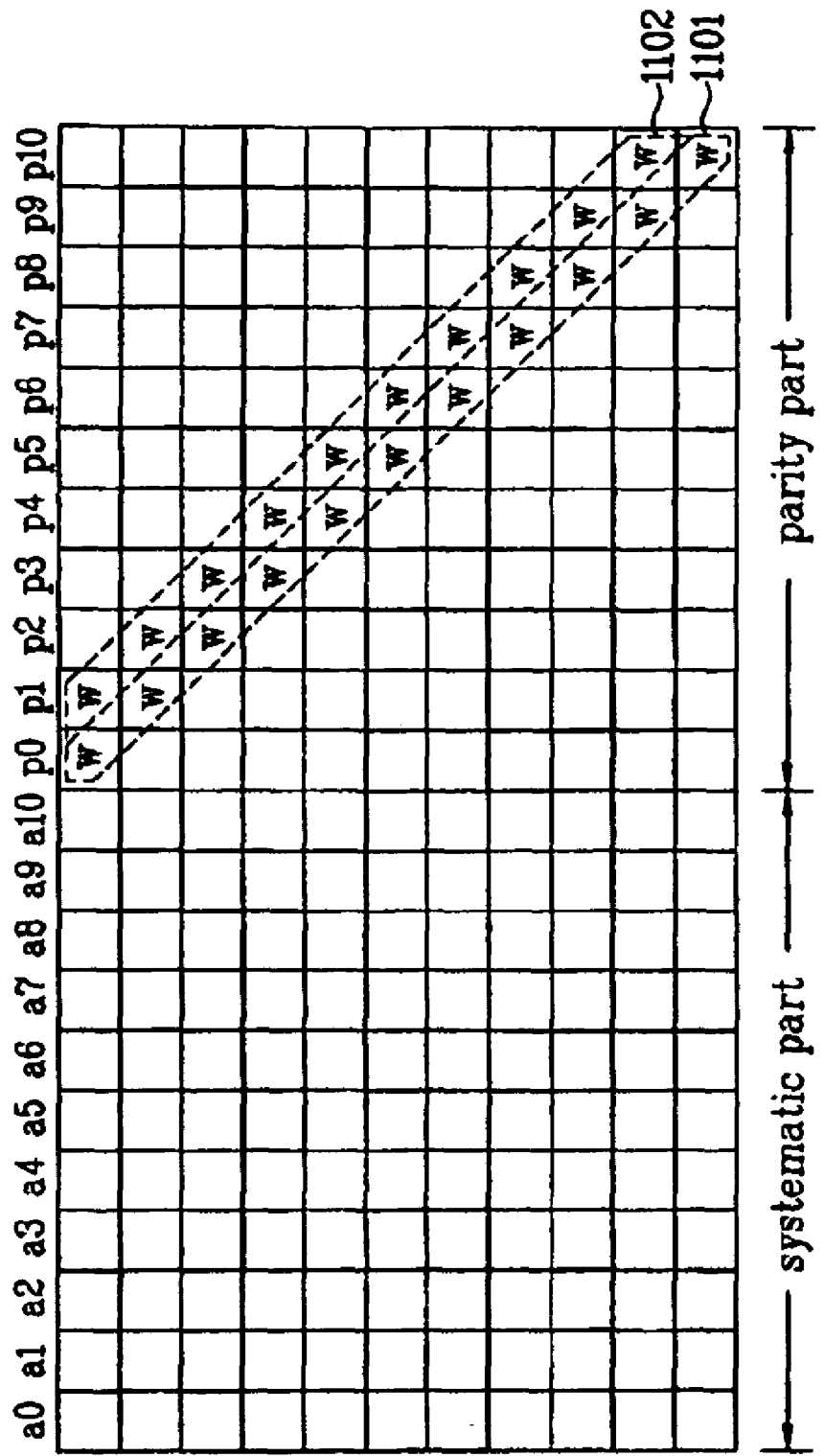
FIG. 11 illustrates an example of a model matrix having dual diagonal elements.

FIG. 11 illustrates an example of a model matrix having dual diagonal elements. In the example of FIG. 11, if it is assumed that the matrix of FIG. 11 is $H_b$, the matrix includes a systematic part $H_d$ corresponding to information bits one to one and a parity part $H_p$. The matrix can be expressed by the following equation 5.

An index of each sub-block excluding the dual diagonal elements is not shown in FIG. 11. Although the sub-block of which index is not shown in the parity part may be a zero matrix, the sub-block of which index is not shown in the systematic part may have a random index. Also, 'w' is an index of a corresponding sub-block, and means that the corresponding sub-block is not a zero matrix. In other words, each row and column of each sub-block marked with 'w' has a weight. Also, the part marked with 'w' does not mean a single index only. This description can be applied to all drawings which will be described later.

$$H_b = [(H_{b1})_{m_b * k_b} | (H_{b2})_{m_b * m_b}]$$ [Equation 5]

The $m_b$ represents the number of sub-blocks located in the model matrix of FIG. 11 in a column direction. Also, $k_b$ represents a value obtained by subtracting the $m_b$ from the number $n_b$ of sub-blocks located in a row direction of the model matrix. In other words, the systematic part of the model matrix has a size of $m_b \times k_b$ in case of a unit of a sub-block. Also, the parity part of the model matrix has a size of $m_b \times m_b$ in case of a unit of a sub-block. A coding rate R is determined by the size of the model matrix, i.e., $R = k_b/(k_b + m_b)$.

The matrix of FIG. 11 includes 11 sub-blocks in a column direction and 22 sub-blocks in a row direction. Each sub-block can be generated by being expanded to a specific sized matrix (for example, z×z sized matrix). Also, the expanded operation is performed depending on shift numbers of each sub-block.

Since the systematic part of the model matrix of FIG. 11 can have various shift numbers (indexes), each index is not shown in FIG. 11 in detail. The parity part of FIG. 11 includes weight elements as shown. Based on the weight elements as shown, the parity part of the matrix of FIG. 11 includes diagonal elements 1101 and their adjacent elements 1102. In other words, the parity part of the matrix of FIG. 11 has dual diagonal elements 1101 and 1102.

Since the LDPC code is a systematic code, parity bits are added to information bits to generate codewords. In other words, if encoding is performed, the structure of the parity part affects encoding performance. Also, since the model matrix used for encoding is also used for decoding, the structure of the parity part greatly affects LDPC encoding and decoding.

Figure 12:
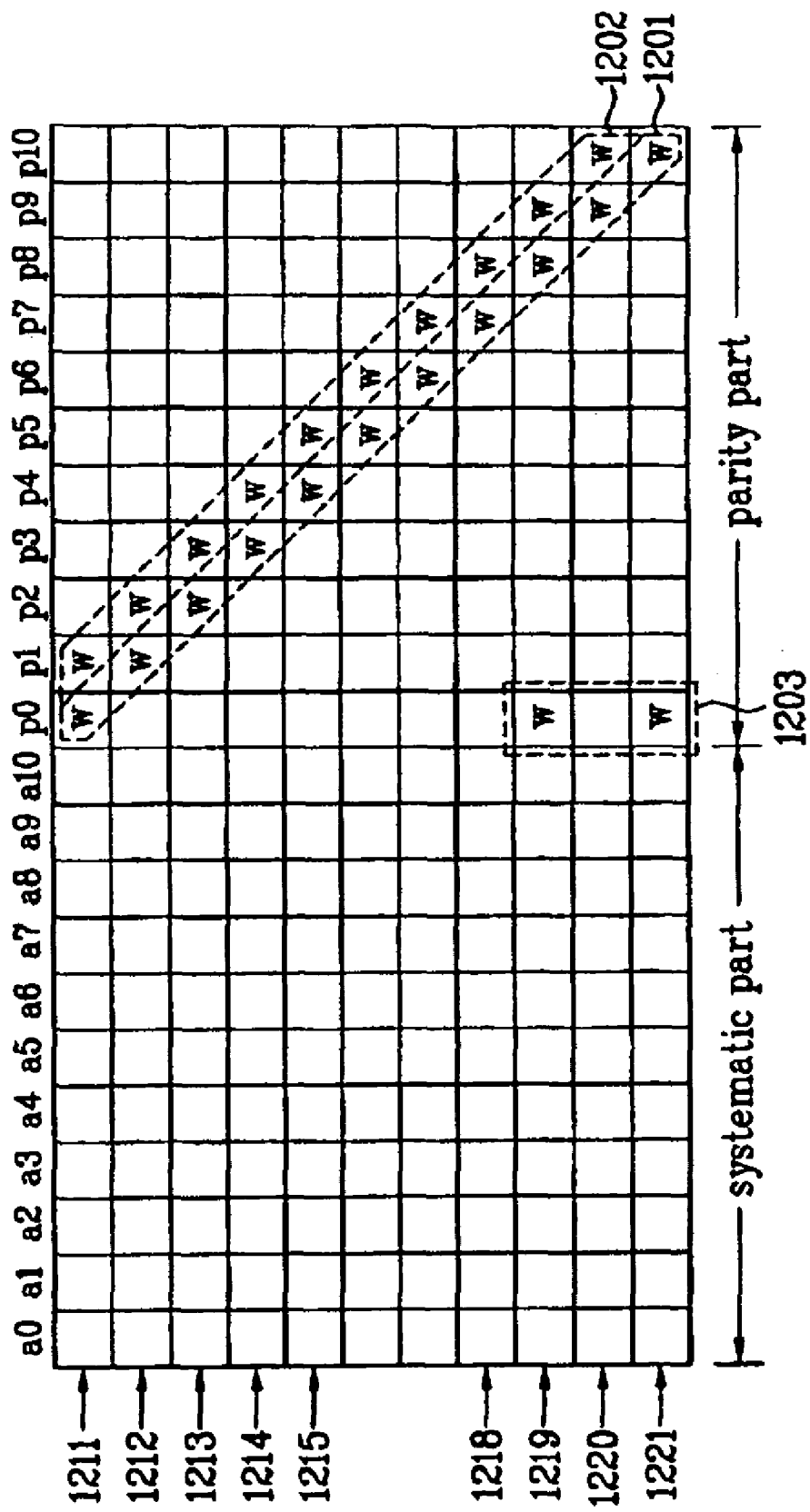
FIG. 12 illustrates another example of a model matrix having dual diagonal elements.

FIG. 12 illustrates another example of a model matrix having dual diagonal elements in accordance with the embodiment of the present invention. The matrix of FIG. 12 has diagonal elements 1201 and their adjacent diagonal elements 1202, i.e., dual diagonal elements 1201 and 1202. The matrix of FIG. 12 also has other elements 1203 excluding the dual diagonal elements 1201 and 1202.

It was known that improved performance can be obtained if encoding is performed using the model matrix of FIG. 12. Each of model matrixes adopted in accordance with the IEEE 802.16e standard has a parity part the same as that of the model matrix of FIG. 12.

Since the first column (first column in a sub-block unit) of the parity part of the model matrix of FIG. 12 has a weight of 3, when calculation is performed for the entire matrix, parity bits included in a parity group $p_0$ are easily calculated.

In other words, parity bits in the LDPC encoding are calculated in such a manner that the parity bits are set as unknown numbers and the unknown numbers are obtained in accordance with the structure of the parity check matrix. In more detail, the parity bits are calculated in such a manner that a polynomial is made based on weight elements in the parity check matrix and unknown numbers are obtained using the polynomial. Since the polynomial is made by binary calculation, respective rows 1211 to 1221 of FIG. 12 are added to one another to erase the unknown numbers in parts where a column weight is an even number. In other words, parts where weight is an even number are erased by a feature of 1+1=0 in a binary addition. In FIG. 12, since the rows 1211, 1219 and 1221 have weights in the first column of the parity part, a weight in any one of the rows 1211, 1219 and 1221 is not erased. Thus, parity bits corresponding to the first column of the parity part are calculated. If the calculated parity bits are input to the row 1211, parity bits corresponding to the second column of the parity part are calculated. Also, if the parity bits corresponding to the first and second columns of the parity part are input to the row 1212, parity bits corresponding to the third column are calculated. This calculation is repeated to easily calculate parity bits of the entire parity part.

Although the model matrix of FIG. 12 is an example of a coding rate of ½, the coding rate may freely be determined depending on the size of the model matrix. Also, the size of the information bit encoded by the model matrix may freely be determined by the size of the sub-block included in the model matrix. The size of row or column of the sub-block may be called 'z-factor.'

Figure 13:
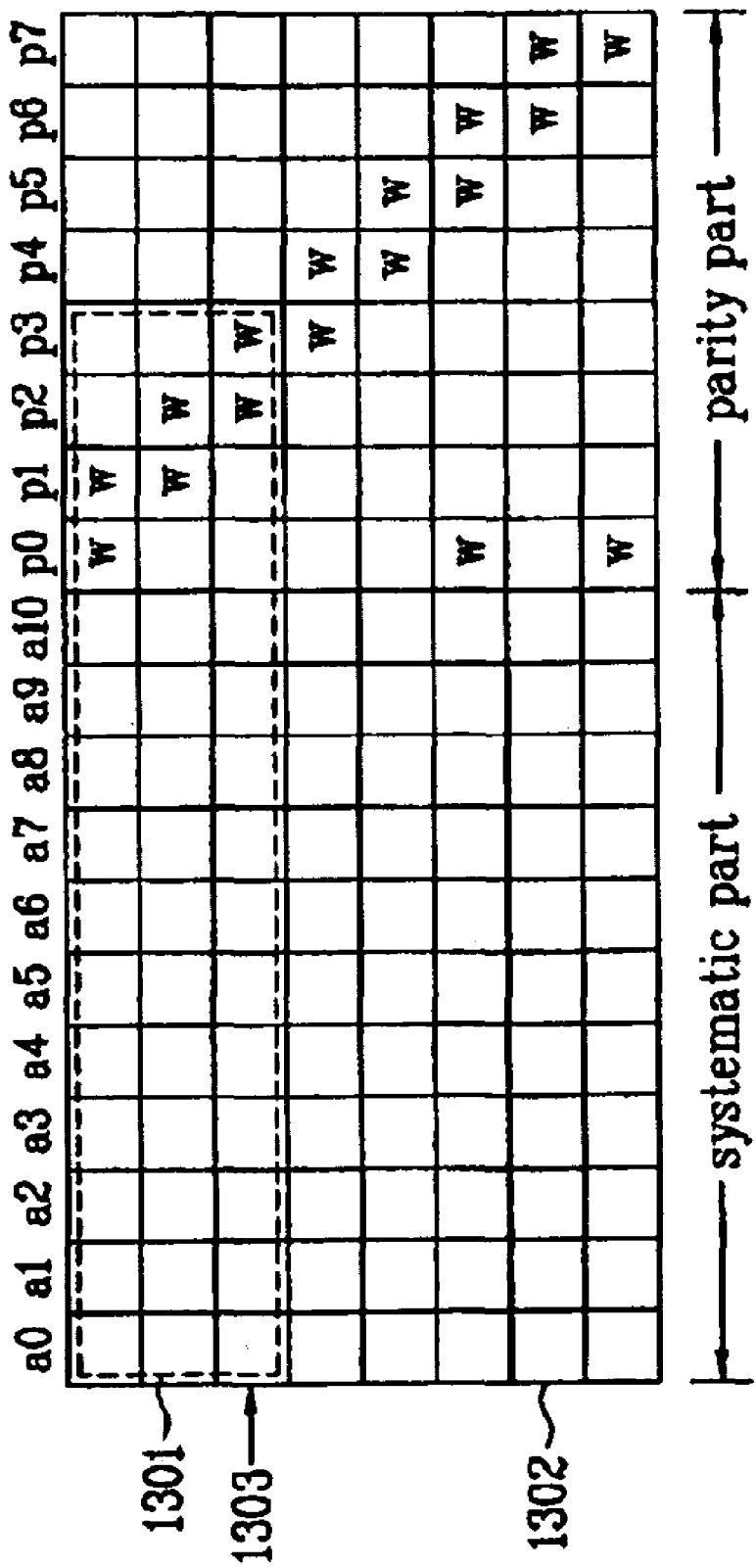
FIG. 13 illustrates a model matrix which is based on a structure of a model matrix of FIG. 12 and supports another coding rate.

FIG. 13 is a model matrix which is based on the structure of the model matrix of FIG. 12 and supports another coding rate. The coding rates according to the matrixes of FIG. 12 and FIG. 13 can be obtained using the above Equation 4.

Although it is known that the model matrix of FIG. 12 or FIG. 13 has excellent performance, a problem occurs in that it is difficult to apply the IR method to the model matrix of FIG. 12 or FIG. 13. For example, if the IR method which supports two coding rates is implemented through the matrix of FIG. 13, the matrix of FIG. 13 can be divided into a region 1301 and a region 1303 depending on the two coding rates. In this case, if the transmitter receives NACK from the receiver after performing encoding through the region 1301 and transmitting the encoded result, the transmitter should perform encoding again through the region 1302. It is noted based on the third row 1303 of FIG. 13 that the location of the weight used when the parity bits are calculated through the region 1301 is different from the location of the weight used when parity bits are calculated through the region 1302. In other words, the parity bits calculated through the region 1301 are different from the parity bits calculated through the region 1302. In more detail, a problem occurs in that the receiver cannot receive initially transmitted data and retransmitted data through combination. This problem can be solved by the model matrix of FIG. 14, which will be described later.

Figure 14:
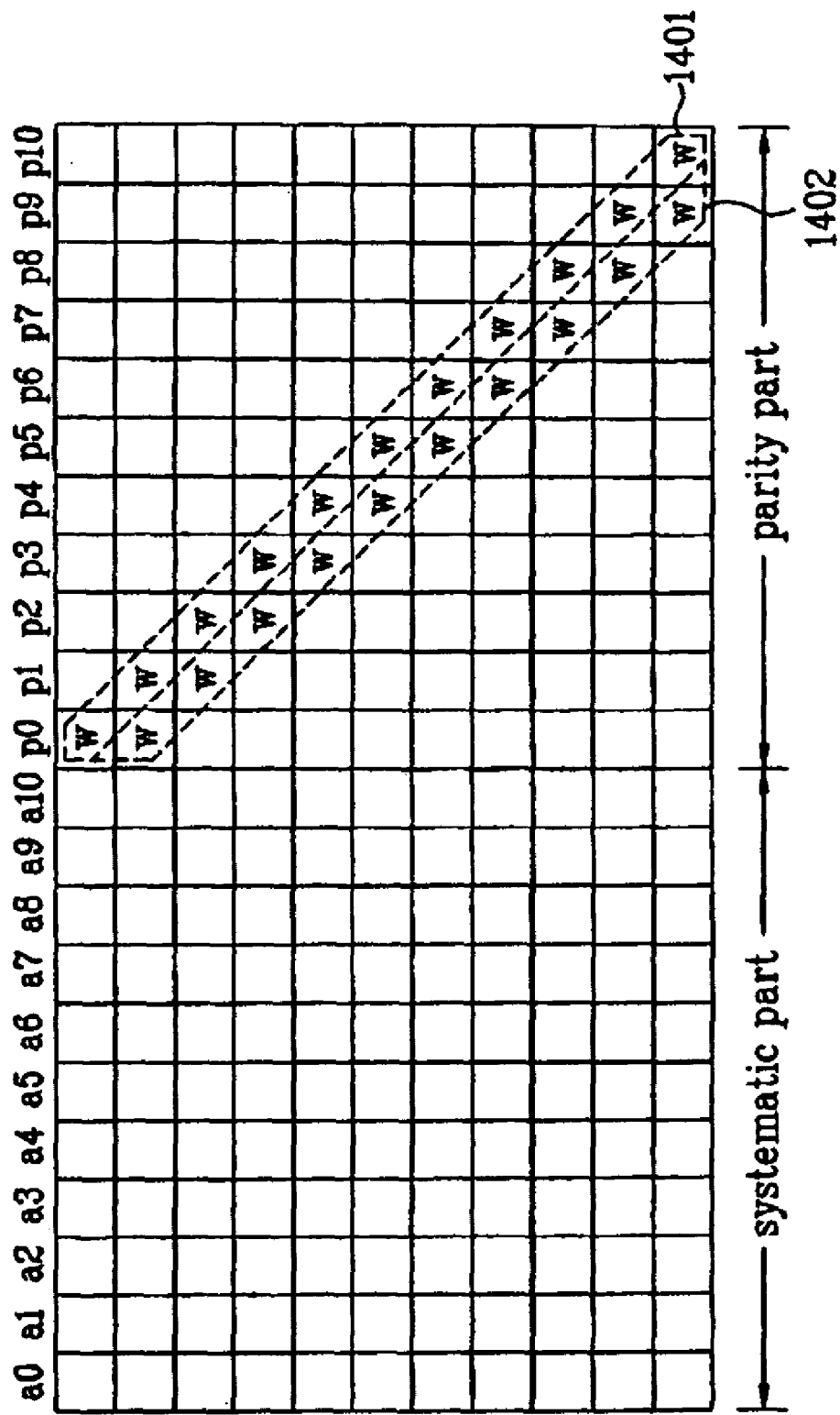
FIG. 14 illustrates a model matrix according to the embodiment of the present invention.

FIG. 14 illustrates an example of the model matrix according to the embodiment of the present invention. Although each sub-block in the systematic part in FIG. 14 can be identified by a specific index, it is omitted in FIG. 14. Like FIG. 11 to FIG. 13, only weight elements are shown in the parity part of FIG. 14, and the other parts having no weight mean zero matrixes. Random weight elements are marked with 'w.' As described above, since 'w' is an integer greater than 0, values 'w' shown in FIG. 14 may be equal to or different from one another. Preferably, each sub-block of the dual diagonal elements is an identity matrix.

The model matrix of FIG. 14 has dual diagonal elements like FIG. 11. In other words, the parity part of FIG. 14 has diagonal elements 1401 and their adjacent diagonal elements 1402. However, in FIG. 14, the adjacent diagonal elements 1402 are located below the diagonal elements 1401. In other words, the adjacent diagonal elements 1402 are located at the left of the diagonal elements 1401. Lower and upper elements and left and right elements of the matrix are variable depending on a viewing direction of the matrix. The model matrix according to the embodiment of FIG. 14 will be described below in view of another aspect.

Assuming that a specific model matrix is $[H_d : H_p]$, a row of a sub-block in the parity part of the model matrix is r, a column thereof is indexed as c, and the number of shifts for a specific sub-block is $A_{r,c}$, the index $A_{r,c}$ has a random integer not '−1' in case of r=c and r=c+1. In other words, if the parity part of the specific model matrix has 4×4 sub-blocks, the parity part is determined as shown in Equation 6 below.

$$\begin{pmatrix} A_{0,0} = x_1 & A_{0,1} = -1 & A_{0,2} = -1 & A_{0,3} = -1 \\ A_{1,0} = x_2 & A_{1,1} = x_3 & A_{1,2} = -1 & A_{1,3} = -1 \\ A_{2,0} = y_1 & A_{2,1} = x_4 & A_{2,2} = x_5 & A_{2,3} = -1 \\ A_{3,0} = y_2 & A_{3,1} = y_3 & A_{3,2} = x_6 & A_{3,3} = x_7 \end{pmatrix} \quad \text{[Equation 6]}$$

In the above equation, $x_i$ represents a random positive integer. Since the dual diagonal elements of the model matrix or the parity check matrix can be arranged variously depending on their design methods, it can be defined that the dual diagonal elements 1401 and 1402 of the model matrix of FIG. 14 have been designed in accordance with a lower triangle type. If the model matrix of FIG. 14 is used, encoding can be performed simply by using an accumulator. Accordingly, the dual diagonal elements 1401 and 1402 of the model matrix of FIG. 14 may be referred to as 'accumulator structured dual diagonal elements.' In other words, it may be defined that the dual diagonal elements 1401 and 1402 of FIG. 14 have been designed in accordance with an accumulator structure.

Meanwhile, it may be defined that the dual diagonal elements of the model matrixes of FIG. 11 to FIG. 13 have been designed in accordance with an upper triangle type.

In short, when the model matrix includes diagonal elements and their adjacent diagonal elements higher than the diagonal elements, the dual diagonal elements of the model matrix have been designed in accordance with the upper triangle type. When the model matrix includes diagonal elements and their adjacent diagonal elements lower than the diagonal elements, the dual diagonal elements of the model matrix have been designed in accordance with the lower triangle type.

If encoding is performed by the model matrix designed in accordance with the upper triangle type, parity bits included in codewords are determined as follows.

If the model matrix is $H_b$, the model matrix can be expressed as follows.

$$H_b = [(H_{b1})_{m_b * k_b} | (H_{b2})_{m_b * m_b}] \quad \text{[Equation 7]}$$

The $k_b$ represents the number of sub-blocks located in the systematic part of the specific model matrix in a row direction. Also, the $m_b$ represents the number of sub-blocks located in the model matrix in a column direction. In other words, the systematic part of the model matrix has a size of $m_b \times k_b$ in case of a unit of a sub-block. Also, the parity part of the model matrix has a size of $m_b \times m_b$ in case of a unit of a sub-block.

The codeword x generated by $H_b$ includes information bits s and parity bits p and can be expressed as follows.

$$x = [s\ p] = [s_0, s_1, \ldots, s_{k-1}, p_0, p_1, \ldots, p_{m-1}], \quad \text{[Equation 8]}$$

As described above, the model matrix consists of sub-blocks of z×z size, and can be divided into $k_b$ number of groups by grouping information bits s for z bits to perform encoding. Although the information bits are conventionally processed in one bit unit, it is assumed for convenience of description that information bits s are grouped for z bits to form $k_b$ number of groups. The information bits s grouped into $k_b$ number of groups can be expressed by a vector as follows.

$$u(i)=[s_{iz}s_{iz+1} \ldots s_{(i+1)z-1}]^T$$

$$u=[u(0)u(1)\ldots u(k_b-1)] \quad \text{[Equation 9]}$$

In the above Equation 9, u(i) is a column vector of which size is z×1.

The parity bits can be expressed as follows by the same grouping method as that used in the Equation 9 above.

$$v(i)=[p_{iz}p_{iz+1}\ldots p_{(i+1)z-1}]^T$$

$$v=[v(0)v(1)\ldots v(m_b-1)] \quad \text{[Equation 10]}$$

In the above Equation 10, v(i) is a column vector of which size is z×1.

The procedure of performing encoding in a unit of z×z by using the model matrix of the upper triangle type can be expressed by the following Equations 11 to 13.

$$P_{p(x,k_b)}v(0) = \sum_{j=0}^{k_b-1}\sum_{i=0}^{m_b-1} P_{p(i,j)}u(j) \quad \text{[Equation 11]}$$

As can be seen from the Equation 11, to calculate z bits among all the parity bits, calculation for the entire systematic part of the model matrix is required.

$$v(1) = \sum_{j=0}^{k_b-1} P_{p(i,j)}u(j) + P_{p(i,k_b)}v(0), \quad \text{[Equation 12]}$$
$$i=0$$

The Equation 12 represents the procedure of obtaining parity bits of next z bits by using first z bits among all the parity bits.

$$v(i+1) = v(i) = \sum_{j=0}^{k_b-1} P_{p(i,j)}u(j) + P_{p(i,k_b)}v(0), \quad \text{[Equation 13]}$$
$$i=1,\ldots,m_b-2$$

The Equation 13 reflexively represents the encoding procedure using the model matrix based on the Equations 11 and 12.

Features of the encoding procedure according to the aforementioned model matrix (consisting of specific sized sub-blocks) will be described as follows.

First, if the parity bits are generated by the model matrix, calculation for the entire systematic part of the model matrix is required to calculate first parity bits among all the parity bits.

In general, if a model matrix having a parity part of a dual diagonal type is used, it is advantageous in that parity bits can be calculated simply through an encoding apparatus operated in the form of an accumulator. Also, if first bits of the parity bits are previously obtained, the parity bits can be obtained simply through the accumulator. However, if the parity part is the upper triangle type, calculation for the entire systematic part is required to obtain first bits of the parity part. Since the calculation amount of the entire systematic part is similar to a calculation amount required to obtain the other parity bits except the first bits, the model matrix of the upper triangle type is characterized in that decoding complexity increases.

Second, if a retransmission method such as HARQ is performed using the model matrix, complexity increases.

If data retransmission is performed at different coding rates in accordance with the retransmission method such as HARQ, the coding rates can be adjusted by controlling the length of the parity bits. If additional parity bits are generated using the model matrix, calculation of the entire systematic part is performed again to calculate only the parity part corresponding to the additional parity bits. As a result, complexity increases if the retransmission method is performed using the model matrix.

The parity part of the model matrix may include other elements in addition to the dual diagonal elements. In other words, the model matrix which includes dual diagonal elements of a lower triangle type may be designed in various types in addition to the matrix of FIG. 14.

FIG. 15A to FIG. 15J illustrate examples of model matrixes which include dual diagonal elements of the lower triangle type. In the model matrixes of FIG. 15A to FIG. 15J, x_1 to x_21, y_1 to y45, and z1 to z55 represent random shift numbers. Since the x_1 to x_21 are dual diagonal elements, they may have various shift numbers excluding '−1' which means a zero matrix. Also, since the systematic part ($H_d$-part) of the model matrix of FIG. 15A to FIG. 15J may have various shift numbers, display of the shift numbers will be omitted.

Figure 15A:
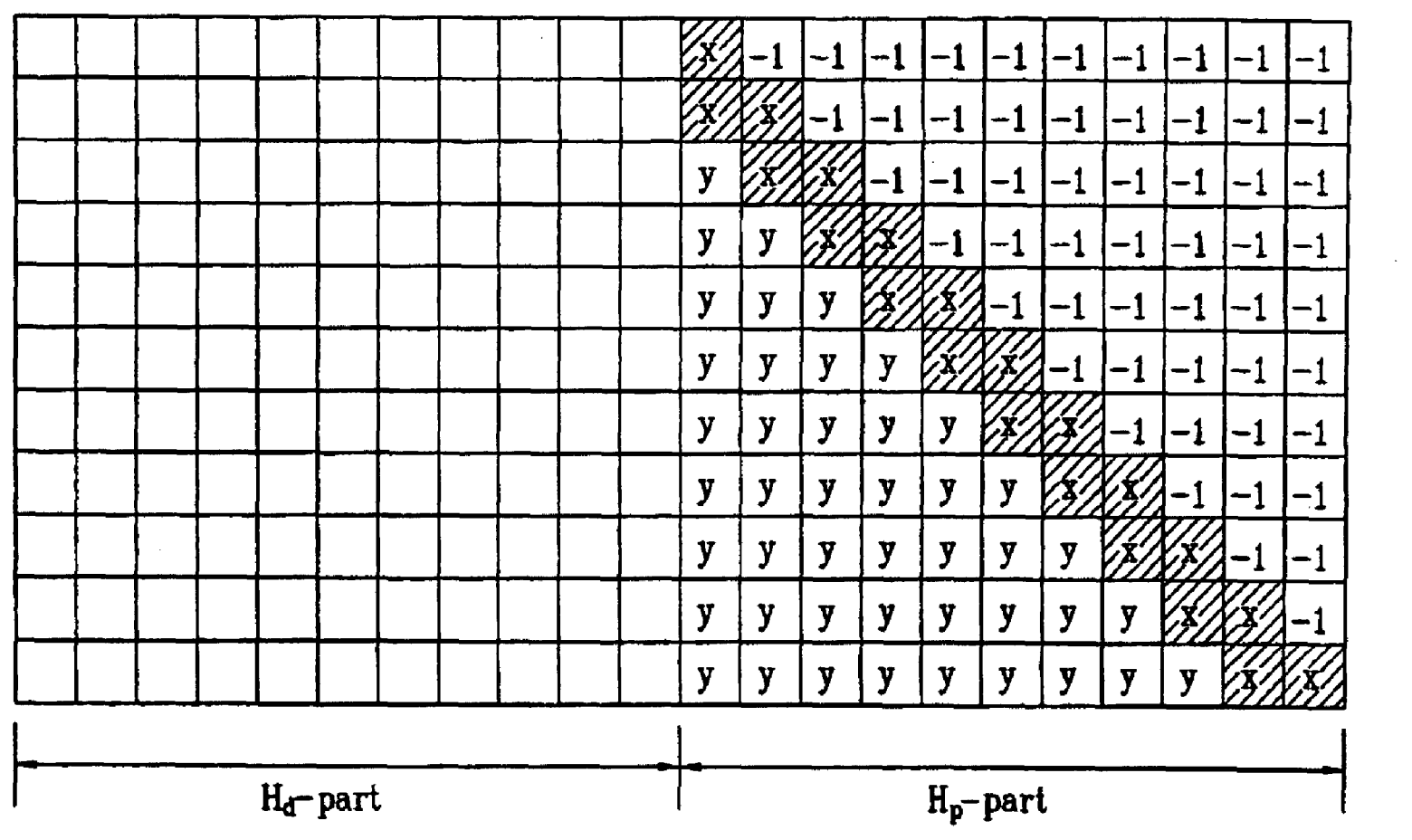
Figure 15B:
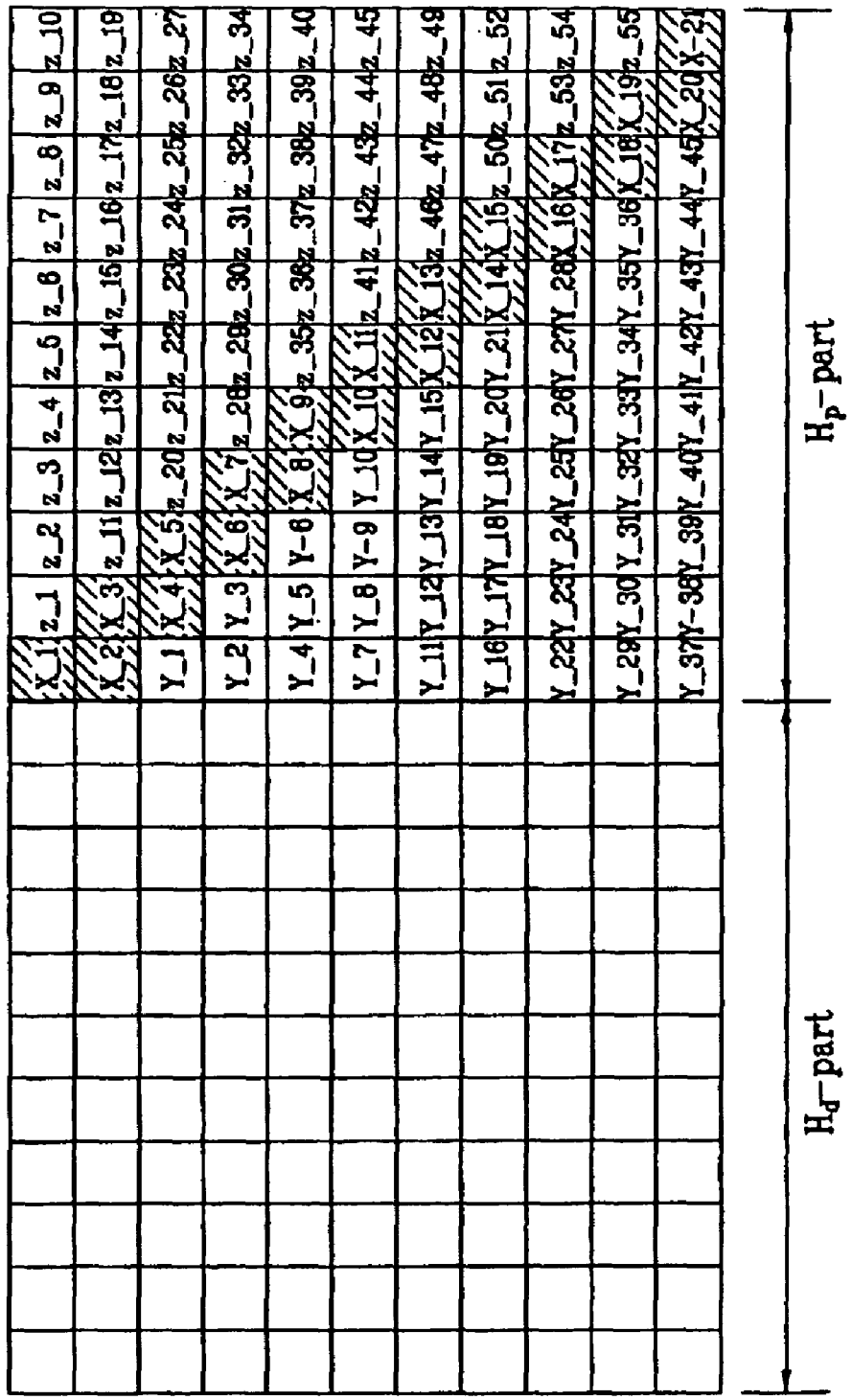
Figure 15C:
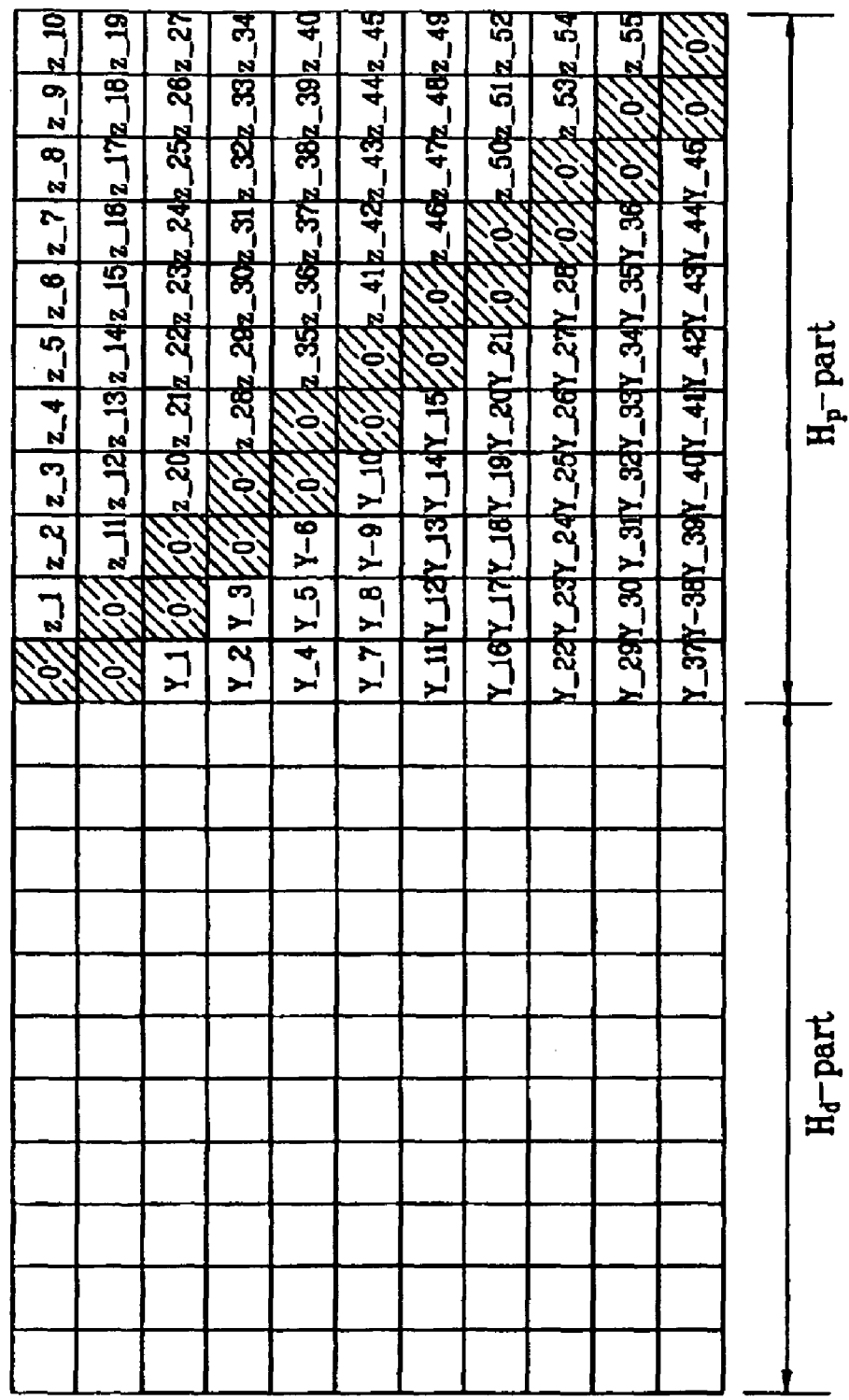
Figure 15D:
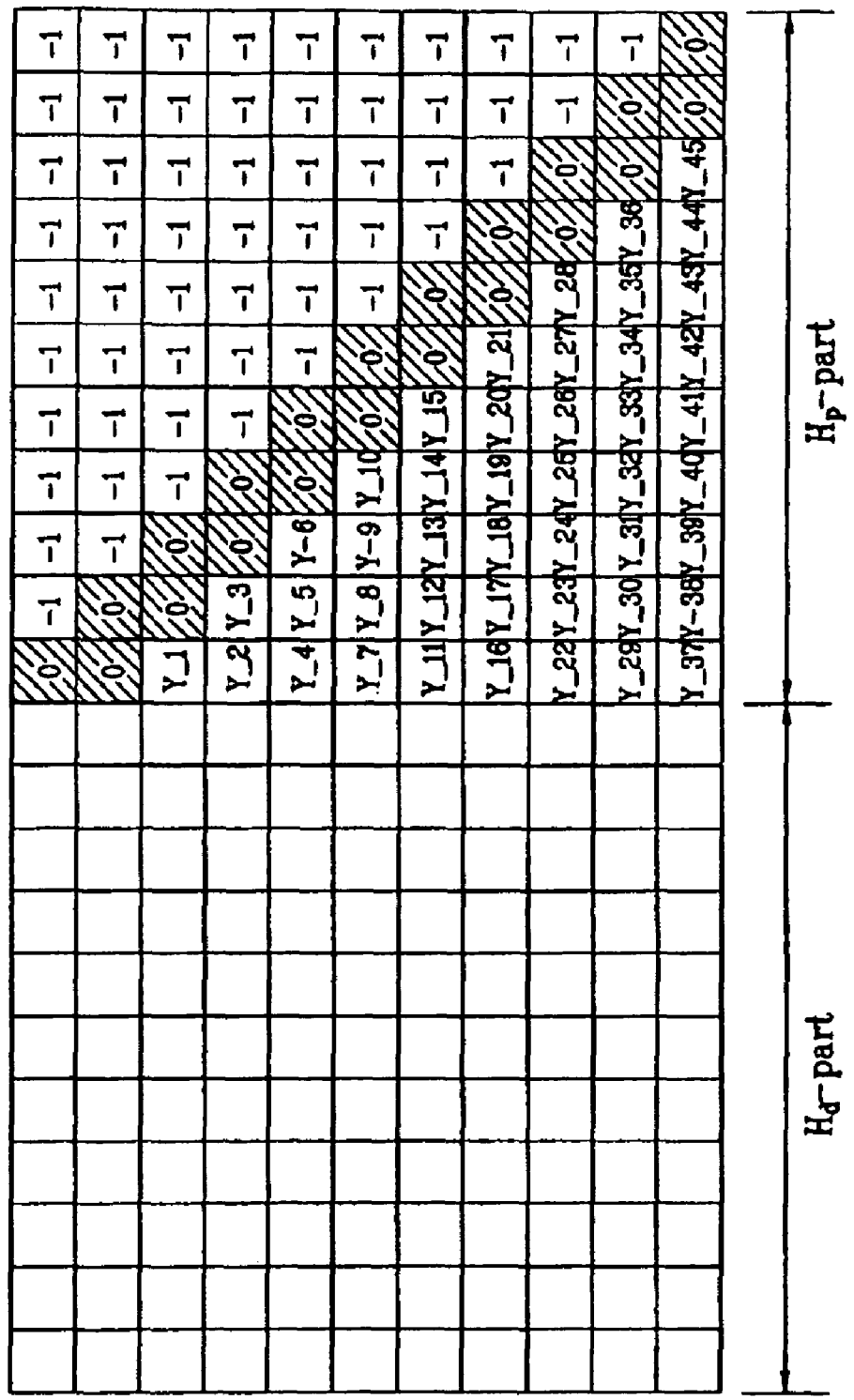
Figure 15E:
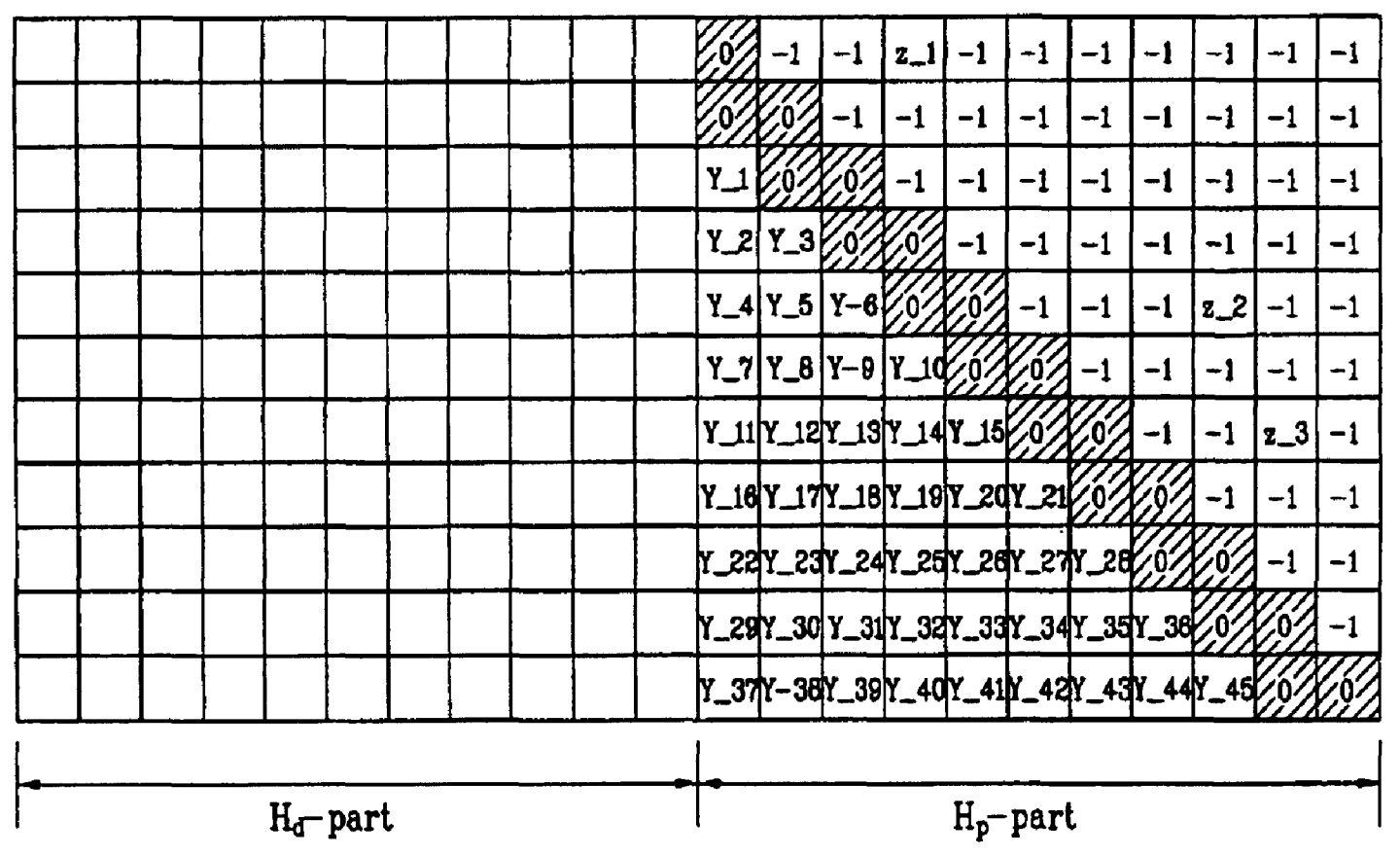
Figure 15F:
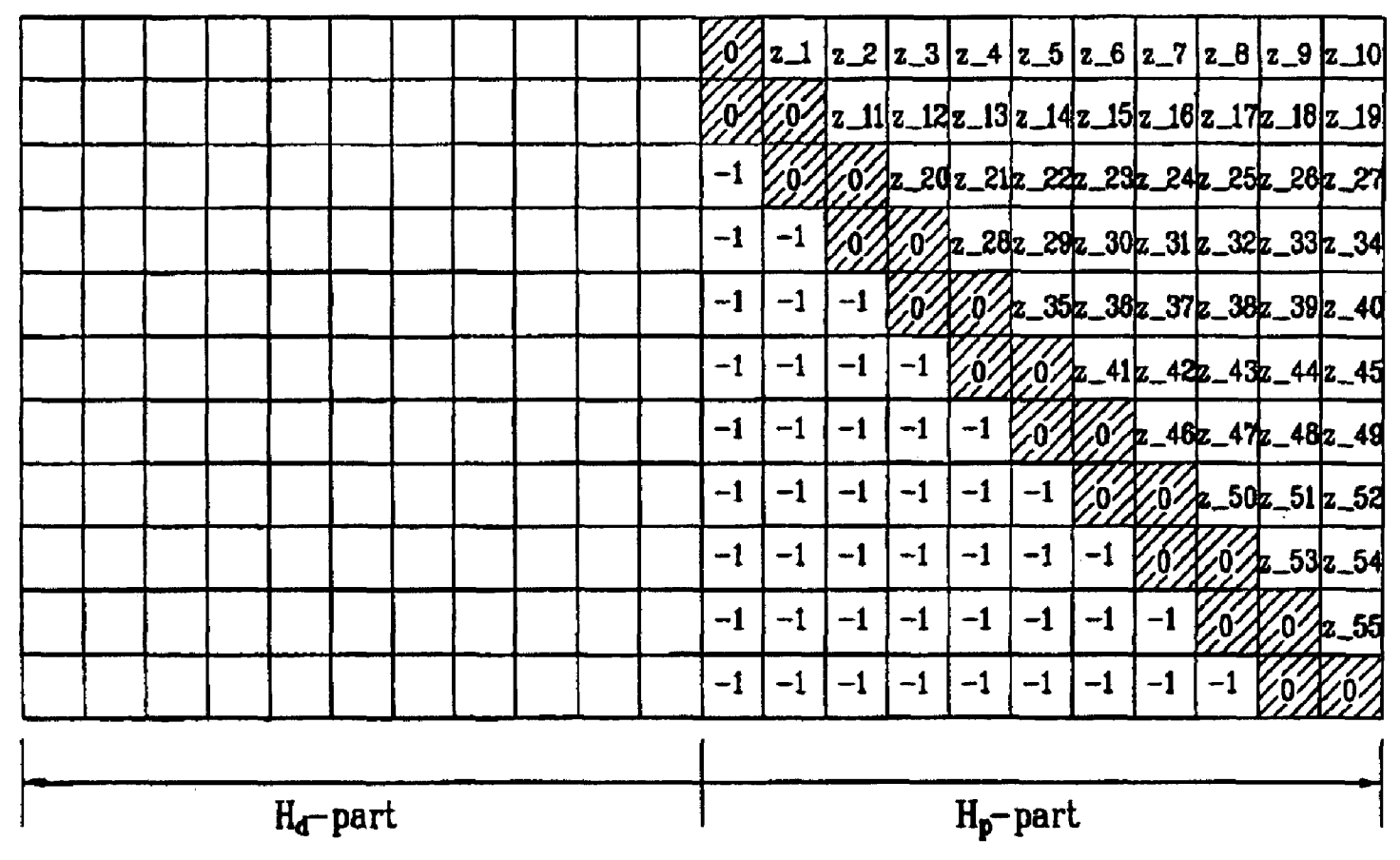
Figure 15G:
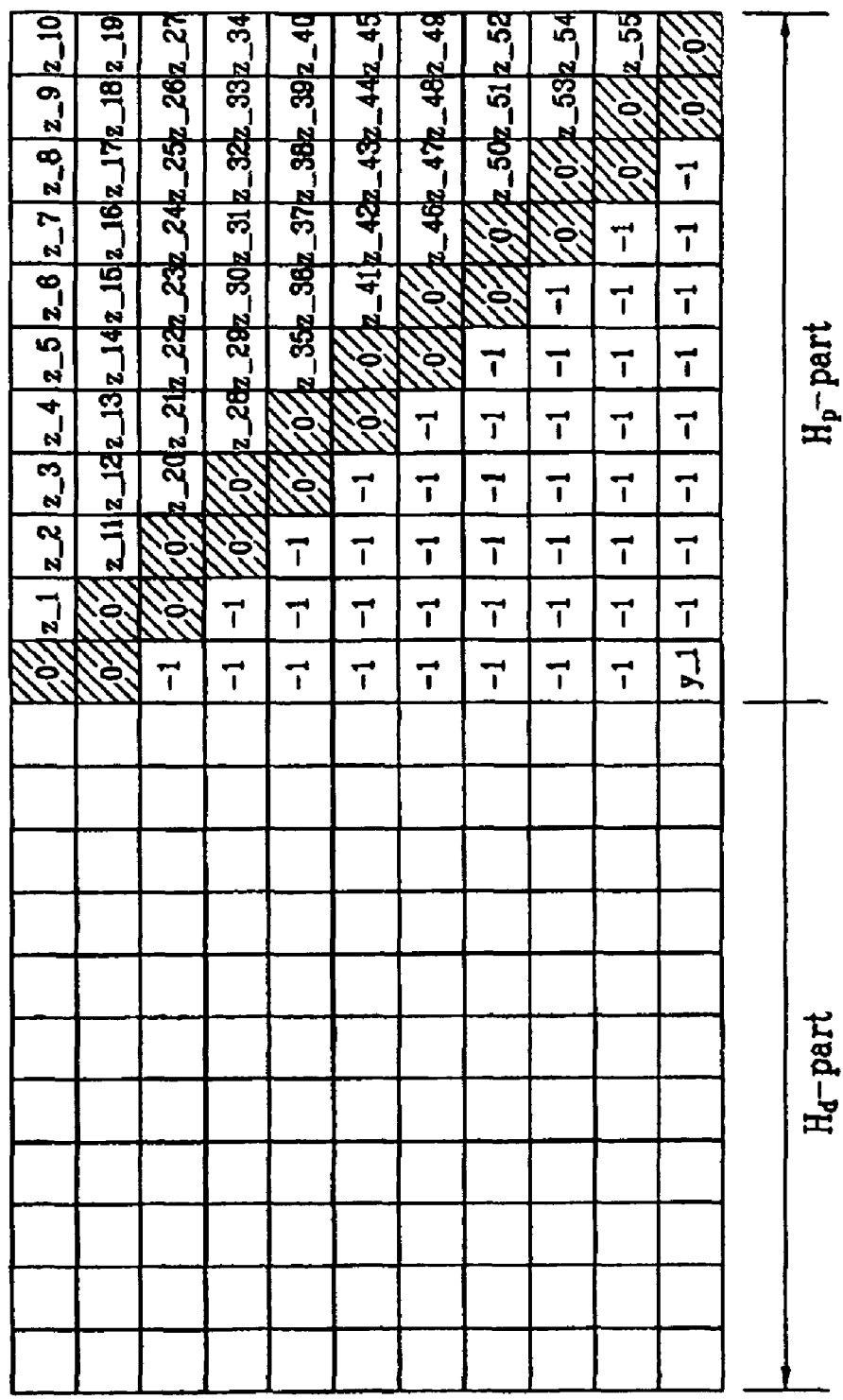
Figure 15H:
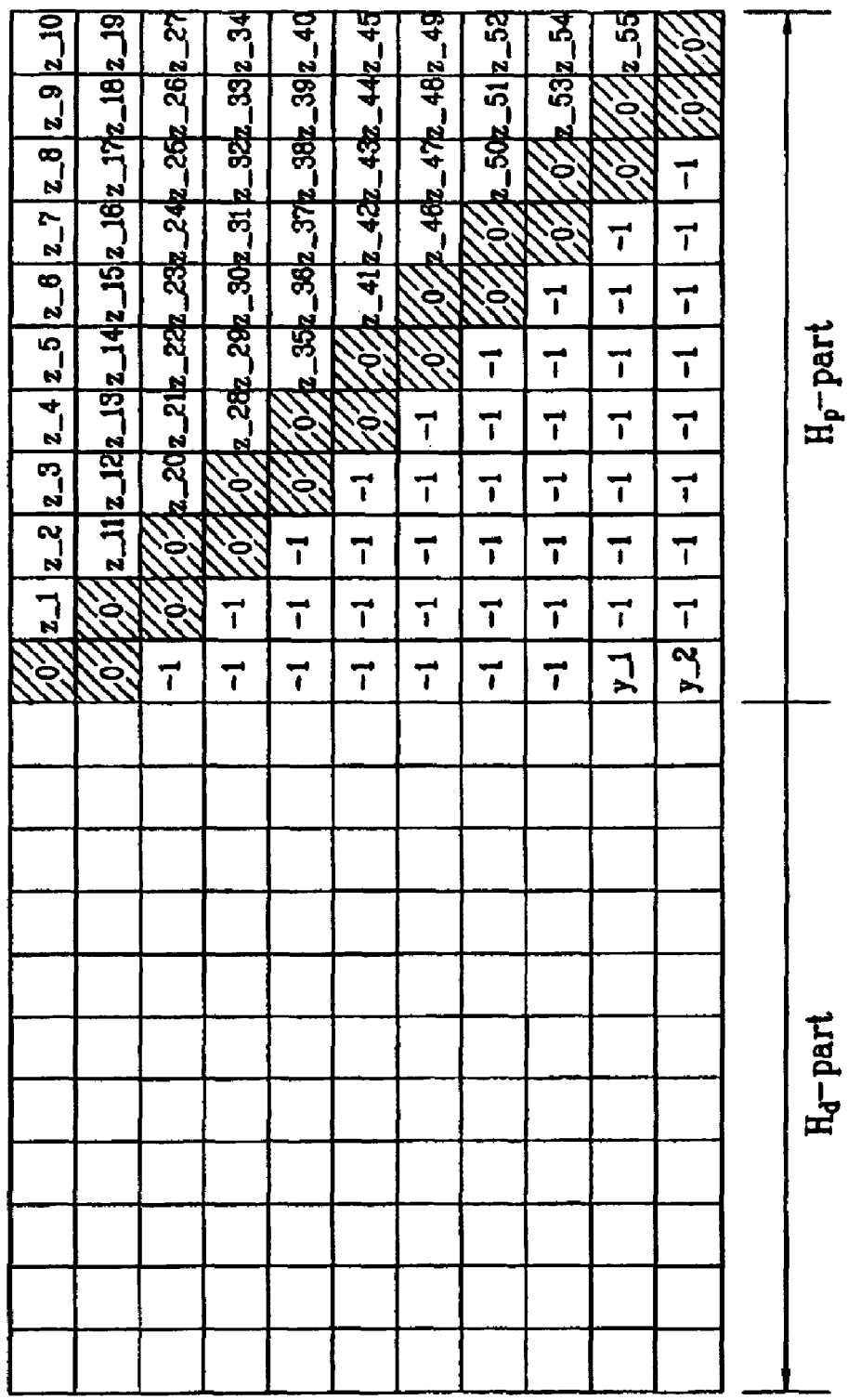
Figure 15I:
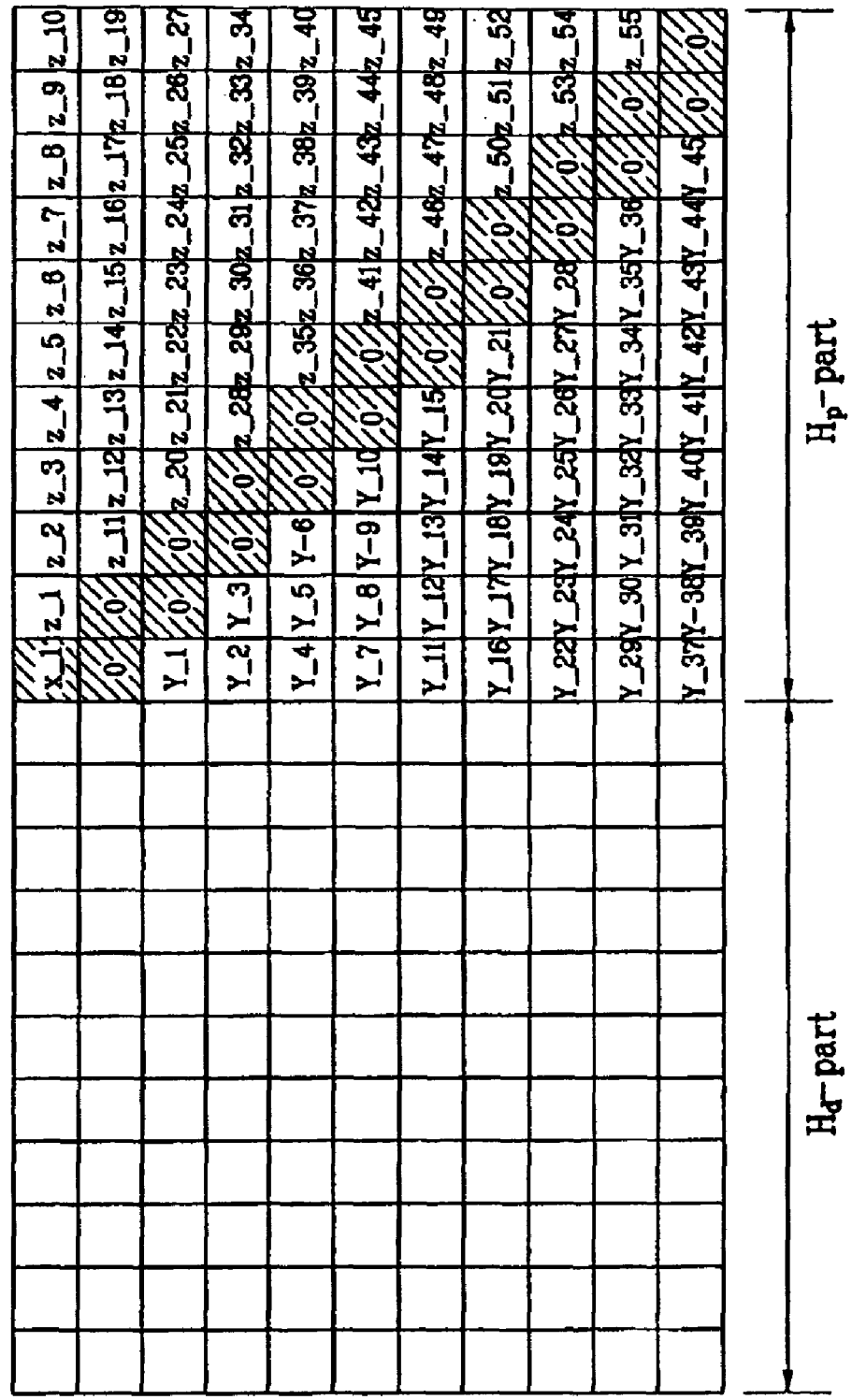
Figure 15J:
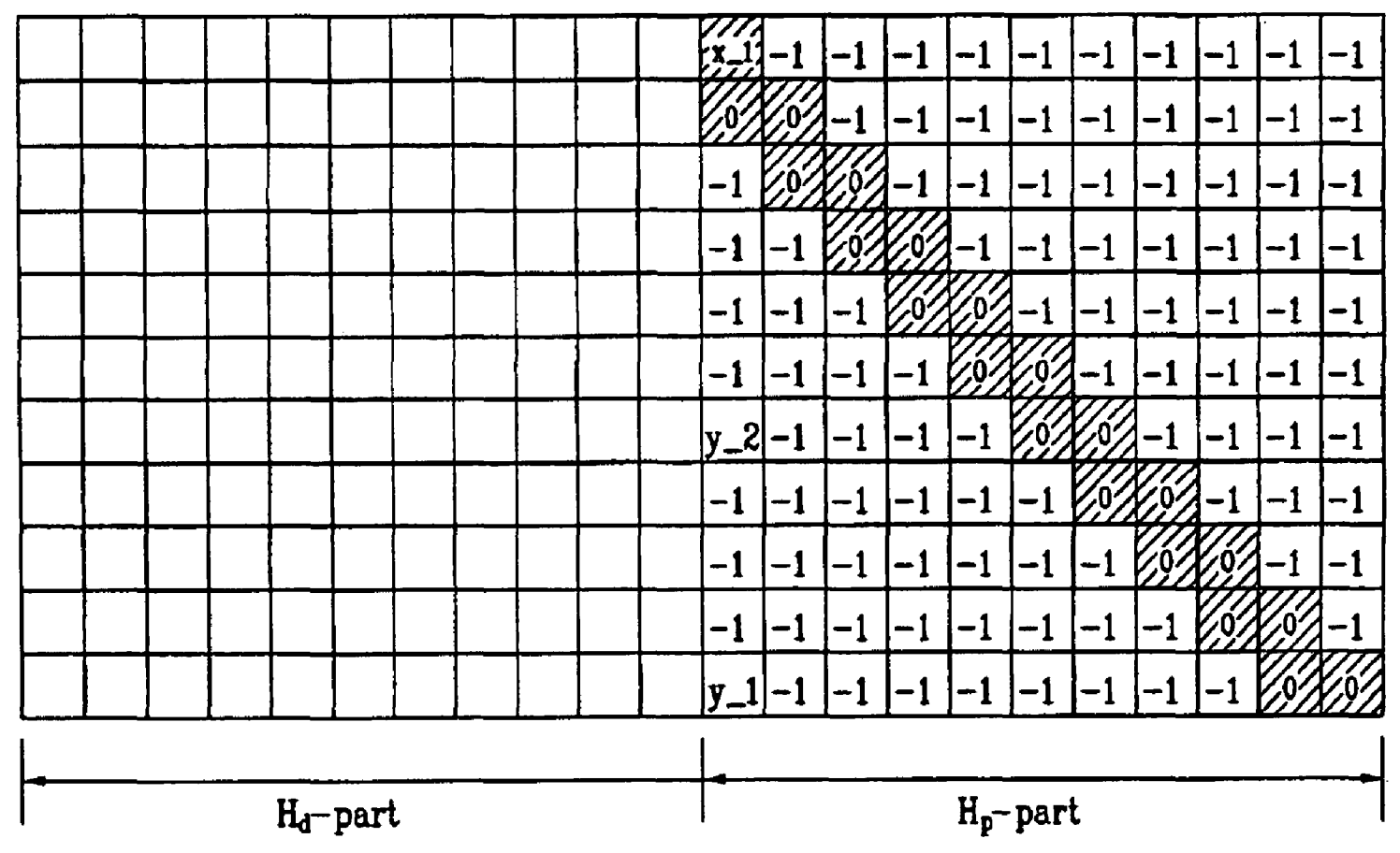

As shown in FIG. 15B, the dual diagonal elements of the model matrix and the other elements except for the dual diagonal elements may have the same value or different values. Also, as shown in FIG. 15C, the dual diagonal elements of the lower triangle type could be shift numbers of '0'. As shown in FIGS. 15D and 15E, the elements located above the dual diagonal elements could be shift numbers of '−1' corresponding to a zero matrix. However, as shown in FIG. 15E, the model matrix may include random elements in addition to the dual diagonal elements of the lower triangle type. In other words, as shown in FIG. 15E, the model matrix may include a specific number of elements z1, z2, z3 not FIG. 15F illustrates another example of the model matrix which includes dual diagonal elements of the lower triangle type. As shown, the elements located below the dual diagonal elements of the model matrix could be shift numbers of '−1' corresponding to a zero matrix. Also, as shown in FIG. 15G and FIG. 15H, some of the elements located below the dual diagonal elements of the model matrix could be elements y_1 not '−1.' FIG. 15I and FIG. 15J illustrate another example of the model matrix which includes dual diagonal elements of the lower triangle type. As shown, the element x_1 of the dual diagonal elements of the lower triangle type could be a random element not '0' and '−1,' and a specific number of elements located in the same column as that of the random element could be random elements not '−1.' The location and number of the elements not which are located in the same column as that of the dual diagonal elements not '0,' can be determined variously. In other words, the location and number of the elements not '−1' can have various values depending on the encoding apparatus which generates parity bits or the structure of the systematic part of the model matrix.

If encoding is performed by the model matrix designed in accordance with the lower triangle type, parity bits included in codewords are determined as follows.

FIG. 16 illustrates an example of encoding performed by the parity check matrix of the lower triangle type according to the embodiment of the present invention. In the example of FIG. 16, although encoding will be described based on the parity check matrix operated in a bit unit for convenience of description, the encoding method according to the embodiment of the present invention may be applied to both the model matrix and the parity check matrix, and the encoding operation may be performed in a bit unit or sub-block unit. Hereinafter, the encoding method according to the embodiment of the present invention will be described with reference to FIG. 16.

Information bits are $a_0$, $a_1$, $a_2$, $a_3$, and parity bits $p_0$, $p_1$, $p_2$, $p_3$ may additionally be provided by the parity check matrix of FIG. 16, so that codewords $c(a_0, a_1, a_2, a_3, p_0, p_1, p_2, p_3)$ are generated. As shown in FIG. 16, among the parity bits, the first parity bit $p_0$ is calculated through calculation of a part of the systematic part of FIG. 16. In other words, $p_0$ can be calculated through only calculation $P_0 = a_1 \oplus a_3$ for the first row of FIG. 16. Also, $p_1$ can be calculated through only calculation $p_1 = a_0 \oplus a_2 \oplus p_0$ for the second row of FIG. 16. When the value $p_1$ is being obtained, the value $p_0$ is required but is not needed to be newly obtained because the value $p_0$ is already calculated. Likewise, $p_2$ and $p_3$ can be obtained. If the parity check matrix of the lower triangle type is used in accordance with the embodiment of the present invention, the parity bits can be obtained through calculation for a part of the systematic part.

Figure 17A:
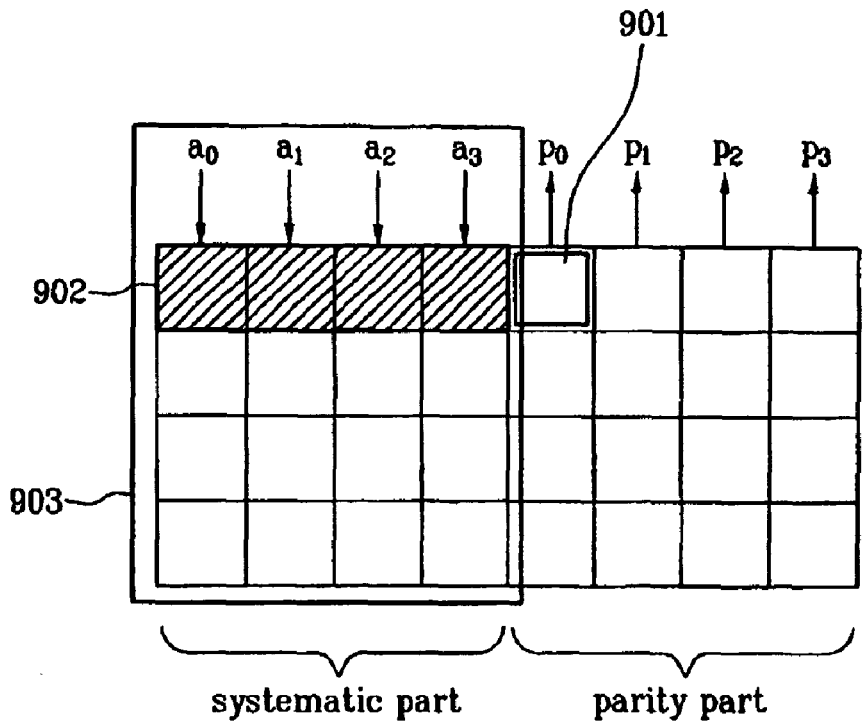
FIG. 17A and FIG. 17B illustrate an encoding method according to the embodiment of the present invention.
Figure 17B:
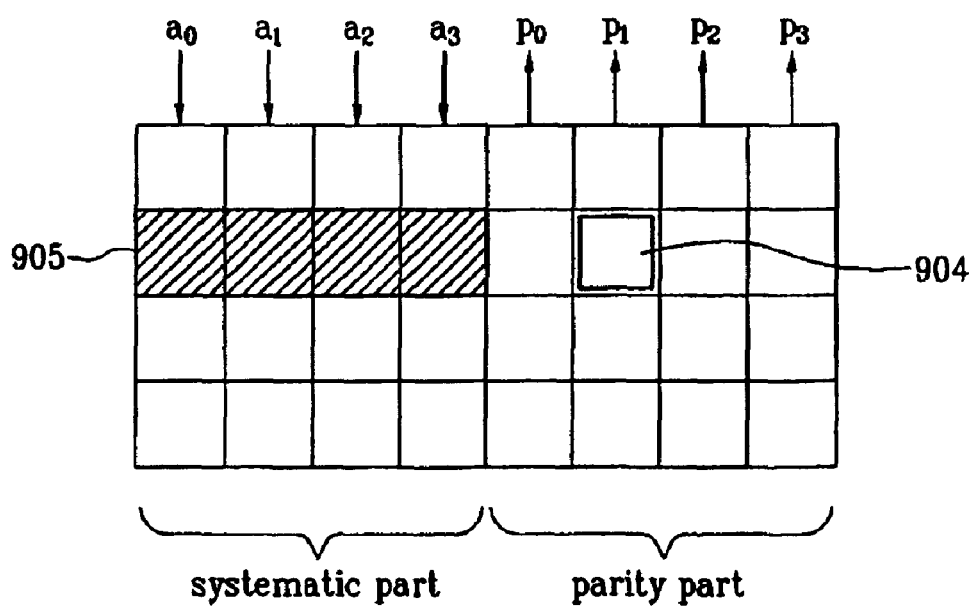

FIG. 17A and FIG. 17B illustrate an encoding method according to another embodiment of the present invention. Hereinafter, the encoding method according to the embodiment of the present invention will be described with reference to FIG. 16, FIG. 17A and FIG. 17B. In FIG. 17A, to obtain $p_0$, calculation for information bits should be performed in accordance with the structure of the parity check matrix. In other words, to obtain a parity value for a region 901, calculation for a region 902 is required. If encoding is performed using the general parity check matrix, calculation for the region 901 should be preceded by calculation for a region 903. However, since the matrix according to the embodiment of the present invention includes the parity part of the lower triangle type, the parity value for the region 901 can be obtained by only calculation for the region 902.

FIG. 17B illustrates a calculation procedure of obtaining $p_1$. In FIG. 17B, to obtain $p_i$, calculation for information bits should be performed in accordance with the structure of the parity check matrix. In other words, to obtain a parity value for a region 904, calculation for a region 905 is required. If encoding is performed using the general parity check matrix, calculation for the region 904 should be preceded by calculation for the region 903.

Consequently, if the parity check matrix of the lower triangle type according to the embodiment of the present invention is used, to obtain first bits (corresponding to the size of sub-block if calculation is performed in a sub-block unit) of the parity bits, calculation for the entire systematic part is not required but calculation for the systematic part corresponding to the parity bits to be generated is required.

Hereinafter, the encoding method performed by the model matrix consisting of sub-blocks of a specific size will be described.

As described above, if it is assumed that the model matrix is $H_b$, the matrix $H_b$ includes a systematic part $H_{b1}$ corresponding to information bits one to one and a parity part $H_{b2}$. The model matrix can be expressed as follows.

$$H_b = [(H_{b1})_{m_b * k_b} | (H_{b2})_{m_b * m_b}]$$  [Equation 14]

FIG. 18 illustrates an example of a model matrix consisting of various sub-blocks $P_{i,j}$ in accordance with the embodiment of the present invention. Although dual diagonal elements of the parity part of the model matrix according to the embodiment of the present invention may have various shift numbers, the operation on the model matrix consisting of dual diagonal elements having shift numbers of '0' will be described below.

The codeword x generated by the $H_b$ includes information bits s and parity bits p, and can be expressed as follows.

$$x = [s\,p] = [s_0, s_1, \ldots, s_{k-1}, p_0, p_1, \ldots, p_{m-1}],$$  [Equation 15]

As described above, the model matrix consists of sub-blocks of z×z size, and can be divided into $k_b$ number of groups by grouping information bits s for z bits to perform encoding. Hereinafter, a method of processing $k_b$ number of groups by grouping information bits s for z bits will be described. The information bits s grouped into $k_b$ number of groups can be expressed by a column vector as follows.

$$u(i) = [s_{iz} s_{iz+1} \ldots s_{(i+1)z-1}]^T$$

$$u = [u(0)u(1) \ldots u(k_b-1)]$$  [Equation 16]

In the above Equation 16, u(i) is a column vector of which size is z×1.

The parity bits can be expressed as follows by the same grouping method as that used in the Equation 16 above.

$$v(i) = [p_{iz} p_{iz+1} \ldots p_{(i+1)z-1}]^T$$

$$v = [v(0)v(1) \ldots v(m_v-1)]$$  [Equation 17]

In the above Equation 17, v(i) is a column vector of which size is z×1.

The procedure of performing encoding in a unit of z×z in accordance with the model matrix of the lower triangle type can be expressed by the following Equations 18 and 19.

$$P_{p(0,k_b)}v(0) = \sum_{j=0}^{k_b-1}(P_{p(0,j)}u(j))$$  [Equation 18]

$$v(i+1) = P_{p(i,k_b)}v(i) + \overset{k_b-1}{\underset{j=0}{Q}} P_{p(i,j)}u(j),$$  [Equation 19]

$$(i = 0, \ldots, m_b - 2).$$

In the above Equations, $P_{p(i,j)}$ represents a matrix generated by being expanded from the sub-block located in the parity part. For example, $P_{p(0,0)}$ represents a sub-block located in the first row and the first column of the specific model matrix. As can be seen from the Equation 18, first z bits among all the parity bits are result values of calculation for the systematic part corresponding to first z bits. Next z bits are calculated by using the results of calculation for the parity part for first z bits and calculation for the systematic part corresponding to next z bits. The procedure of calculating the parity bits can be expressed by a reflexive method such as the above Equation 19.

As can be seen from the Equation above, if encoding is performed using the matrix of the lower triangle type in accordance with the embodiment of the present invention, it is advantageous in that encoding is completed through smaller calculation amount.

The receiver which receives a signal encoded in accordance with the embodiment of the present invention can receive desired data by performing decoding using the matrix of the lower triangle type.

If the model matrix which includes dual diagonal elements of the lower triangle type is used, the IR method can be implemented easily. Hereinafter, a method of implementing the IR method will be described with reference to FIG. 19.

Figure 19:
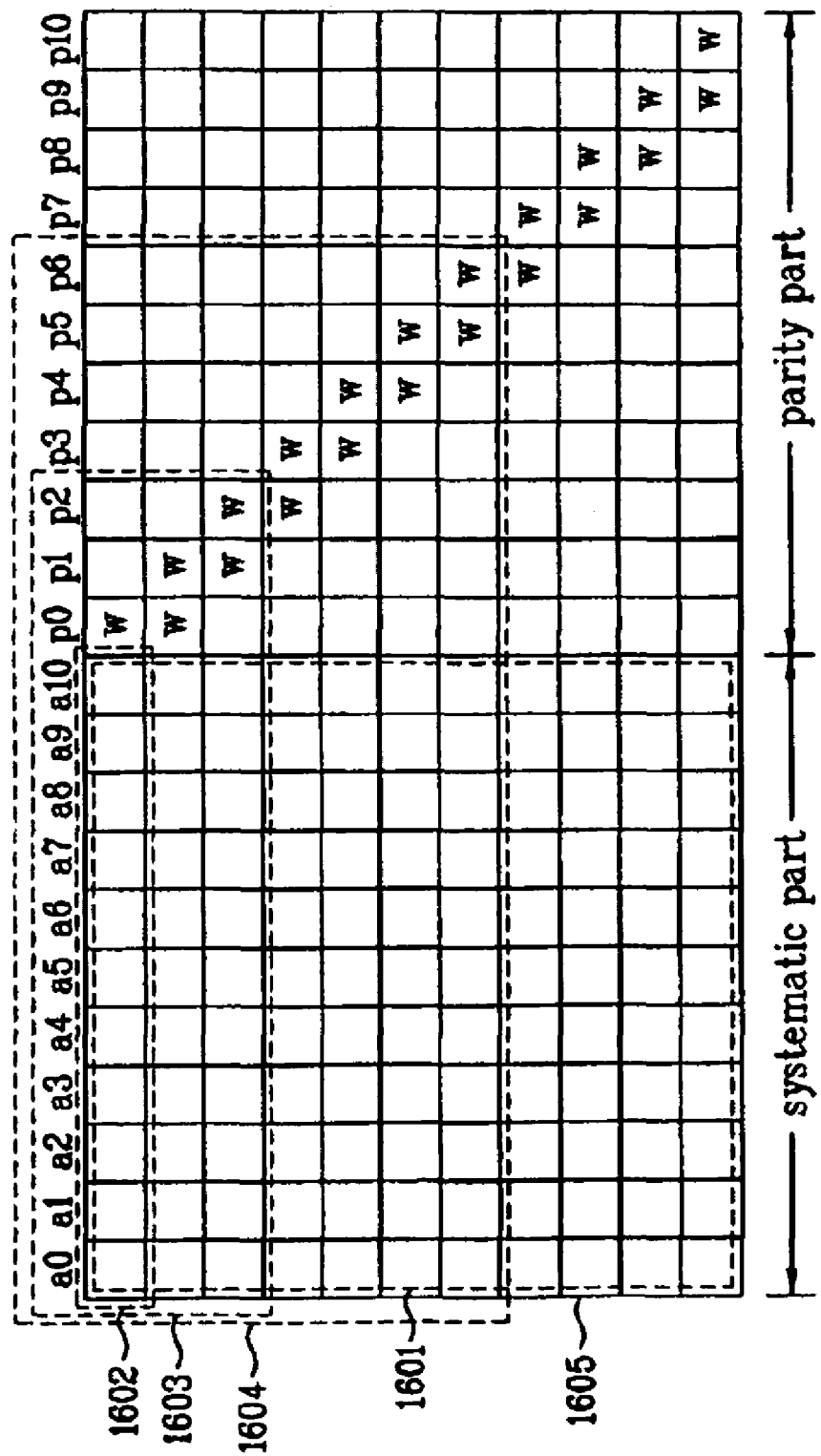
FIG. 19 illustrates a concept which supports an IR (Incremental Redundancy) method by dividing a matrix which includes dual diagonal elements of a low triangle type into a specific number of regions in accordance with the embodiment of the present invention.

FIG. 19 illustrates an example of the model matrix according to the embodiment of the present invention. According to the embodiment of FIG. 19, the matrix which includes dual diagonal elements of the lower triangle type is divided into a plurality of regions to support the IR method. If the dual diagonal elements of the lower triangle type are used, the parity bits can be obtained even in case that calculation for the entire systematic part is not performed. In case of the dual diagonal elements designed in accordance with the upper triangle type, calculation for the entire systematic part 1601 of FIG. 19 is required to calculate parity bits included in a parity group $p_0$ of FIG. 19. However, in case of the dual diagonal elements designed in accordance with the lower triangle type, the parity bits $p_0$ can be calculated through calculation for the systematic part 1602 corresponding to the parity parts to be calculated.

If the dual diagonal elements of the lower triangle type are used, the IR method can be implemented easily. If the IR method which supports three coding rates is implemented, one model matrix is divided into three regions 1603, 1604 and 1605 in accordance with a coding rate to be supported. And, encoding is performed at a first coding rate to transmit data. In this case, encoding for information bits $a_0$ to $a_{10}$ is performed using the region 1603 corresponding to the first coding rate. Codewords generated by the first encoding consist of $[a_0, a_1, a_2, a_{10}, p_0, p_1, p_2]$.

If the transmitter receives NACK from the receiver after transmitting the codewords, the transmitter should retransmit data in accordance with a second coding rate. In this case, encoding for the information bits $a_0$ to $a_{10}$ is performed again using the region 1604 corresponding to the second coding rate. In this case, parity groups $p_0$, $p_1$ and $p_2$ remain unchanged due to characteristics of the dual diagonal elements of the lower triangle type while parity groups $p_3$, $p_4$, $p_5$, and $p_6$ are additionally generated. Accordingly, the transmitter transmits parity bits of the additional parity groups $p_3$, $p_4$, $p_5$, and $p_6$ during retransmission. The receiver combines the initially received data with the retransmitted data to perform decoding and determines ACK/NACK.

If the transmitter receives NACK from the receiver again, the transmitter should retransmit the data in accordance with a third coding rate. In this case, encoding for the information bits $a_0$ to $a_{10}$ is performed again using the region 1605 (entire matrix shown in FIG. 19) corresponding to the third coding rate. In this case, parity groups $p_0$ to $p_6$ remain unchanged due to characteristics of the matrix of the lower triangle type while parity groups $p_7$, $p_8$, $p_9$, and $p_{10}$ are additionally generated. Accordingly, the transmitter transmits parity bits of the additional parity groups $p_7$, $p_8$, $p_9$, and $p_{10}$ during retransmission. The receiver combines the initially received data with the retransmitted data to perform decoding.

If the model matrix which includes dual diagonal elements of the lower triangle type is used, the IR method can be supported. However, in this case, a problem occurs in that LDPC decoding performance may be deteriorated.

Hereinafter, the problem of performance deterioration will be described, which may occur if the dual diagonal elements of the lower triangle type are used.

Decoding by the LDPC code is mainly performed on a bipartite graph by a message-passing method. Accordingly, when a parity check matrix used for LDPC decoding is drafted by a bipartite graph, LDPC decoding performance is affected in accordance with connection status of respective nodes.

Figure 20:
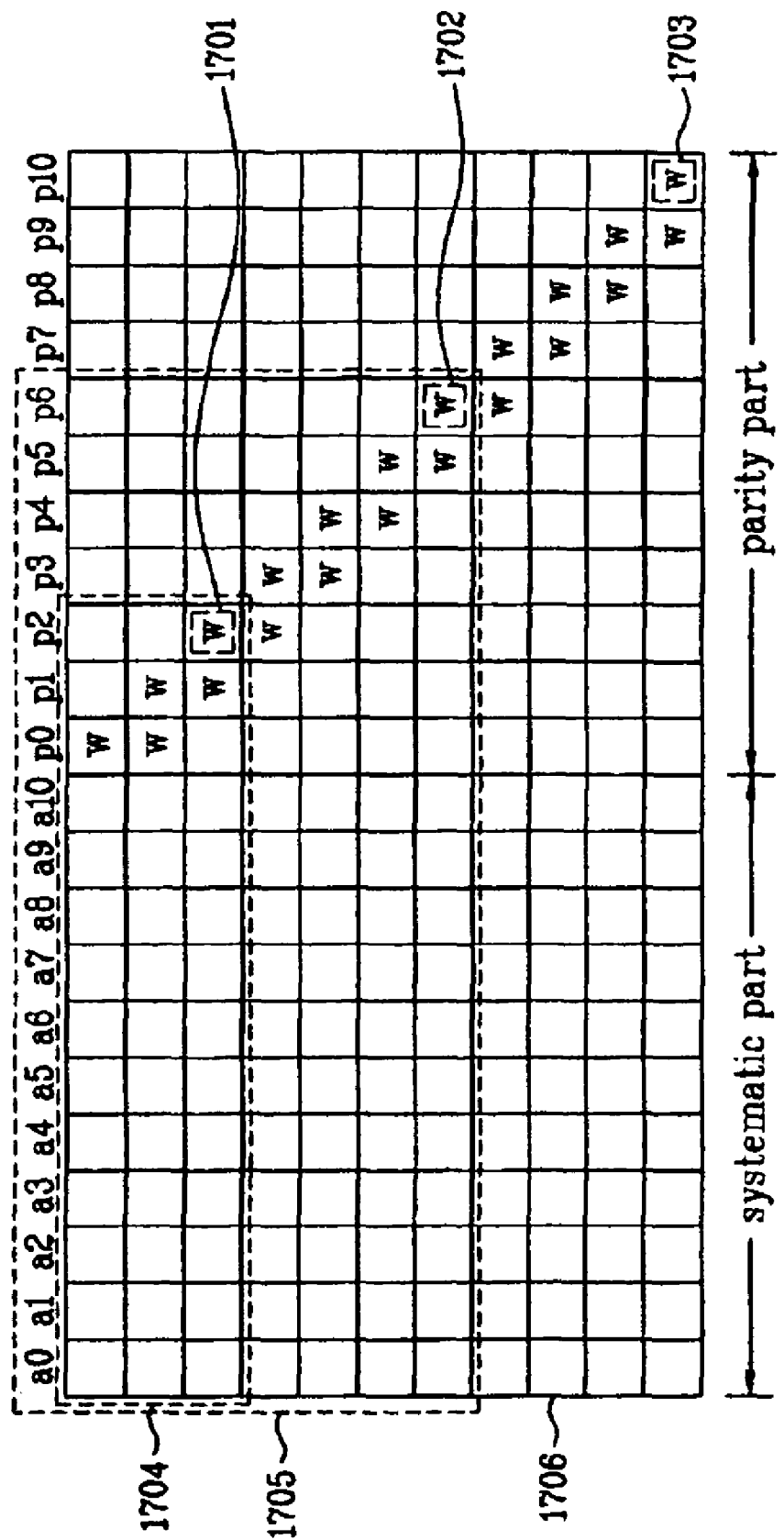
FIG. 20 illustrates a model matrix which includes dual diagonal elements of a lower triangle type in accordance with the embodiment of the present invention.

FIG. 20 illustrates a model matrix which includes dual diagonal elements of a lower triangle type in accordance with the embodiment of the present invention. Each sub-block constituting dual diagonal elements of the parity part of the model matrix shown in FIG. 20 is a permutation matrix generated by shifting row or column of an identity matrix in a certain direction at a predetermined interval. 'W' means that each sub-block has a weight but does not mean that indexes of respective sub-blocks are equal to one another. Row and column of each sub-block constituting the dual diagonal elements have a weight of '1.'

As shown in FIG. 20, the model matrix having the lower triangle type structure has a weight of '1' in a column direction of a predetermined region. In other words, if the matrix of FIG. 20 is divided into three regions 1704, 1705 and 1706, the last column of the region 1704 has a column weight of 1. Also, the last column of the region 1705 has a column weight of 1, and the last column of the region 1706 (entire matrix of FIG. 20) has a column weight of 1. In other words, the column weight becomes 1 by indexes of the regions 1701 to 1703.

If the column weight becomes 1, a problem occurs in that message passing is not performed desirably during decoding. For this reason, it is likely that decoding performance may be deteriorated. Particularly, if the column weight of the parity part in the region 1704 corresponding to a high coding rate is equal to 1, performance deterioration may occur seriously.

The aforementioned description can be arranged as follows. As described with reference to FIG. 13, if the parity part of the upper triangle type is configured, a problem occurs in that it is difficult to apply the IR method. However, if the dual diagonal elements of the lower triangle type or the accumulator structure suggested in the embodiment of the present invention are used as described with reference to FIG. 19, the IR method can be implemented easily. However, if the dual diagonal elements of the lower triangle type are used, the problem of message passing may occur as described with reference to FIG. 20. To solve the problem of message passing, a model matrix of FIG. 21 may be considered.

Figure 21:
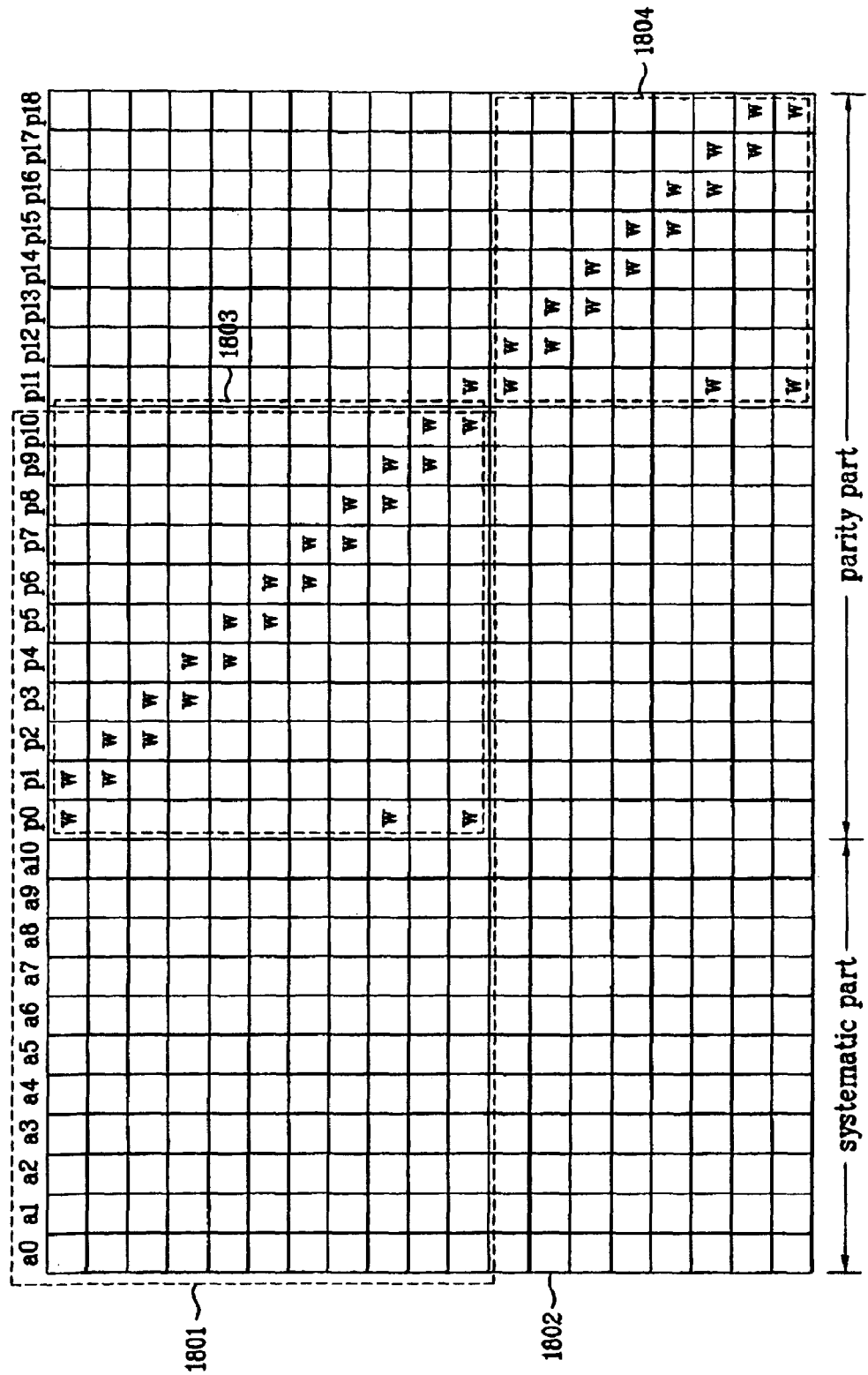
FIG. 21 illustrates a model matrix which supports two coding rates in accordance with the embodiment of the present invention.

FIG. 21 illustrates an example of a model matrix according to the embodiment of the present invention, which supports two coding rates. In more detail, a region 1801 corresponds to the first coding rate, and a region 1802 corresponds to the second coding rate. Also, the first coding rate is higher than the second coding rate. At this time, a model matrix corresponding to each coding rate is referred to as a sub-matrix.

The parity part of FIG. 21 includes two sub-parity parts 1803 and 1804 according to the aforementioned 'upper triangle type.' In other words, the parity part of FIG. 21 is arranged in such a manner that the matrix of the sub-parity part 1803 and the matrix of the sub-parity part 1804 are disjointed from each other. The sub-parity part means a part constituting the parity part of the specific model matrix. For example, in FIG. 21, a sub-matrix 1802 corresponding to the second coding rate includes a first sub-matrix 1801 corresponding to the first coding rate. In this case, the sub-parity part of the first sub-matrix corresponds to the part marked with '1803' and the sub-parity part of the second sub-matrix corresponds to the part marked with '1804.' The sub-parity part may be referred to as 'sub-structured parity part.'

In the matrix of FIG. 21, values of the parity groups $p_0$ to $p_{10}$ calculated in accordance with the region 1801 are not affected by calculation by the region 1802 (entire matrix of FIG. 21). Accordingly, the IR method can be applied to the matrix of FIG. 21. However, since there is no connection node between the regions 1803 and 1804, a problem occurs in decoding performance.

Hereinafter, a model matrix which solves the aforementioned problems will be described. The model matrix suggested in the embodiment of the present invention supports the IR method. Also, if the matrix is divided into a plurality of regions, the problem of message passing is solved. Also, the problem occurring due to no connection node between some regions of the parity part is solved.

Figure 22:
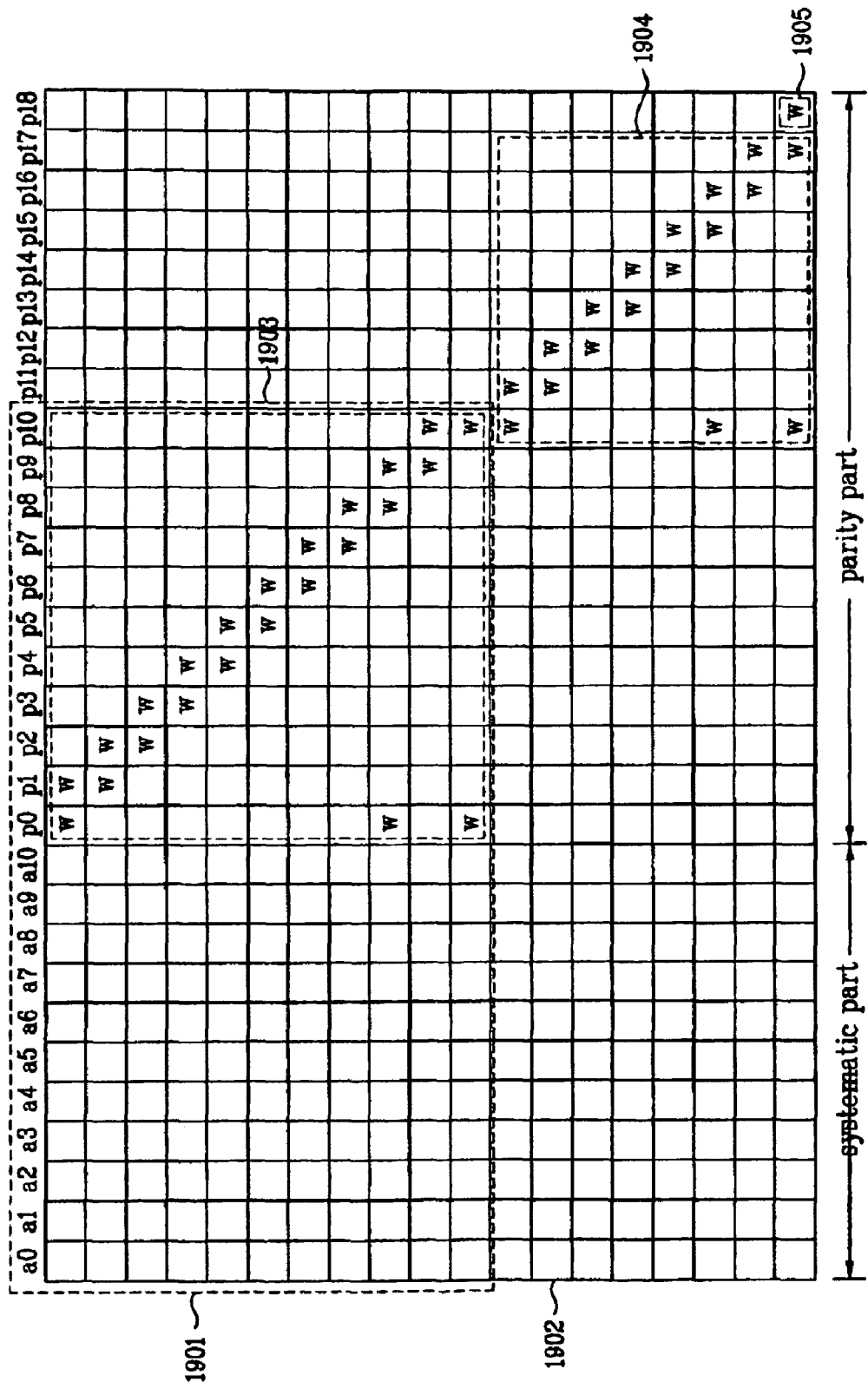
FIG. 22 illustrates another example of a model matrix which supports two coding rates in accordance with the embodiment of the present invention.

FIG. 22 illustrates an example of a model matrix according to the embodiment of the present invention, which supports two coding rates. In more detail, a region 1901 corresponds to the first coding rate, and a region 1902 (entire matrix of FIG. 22) corresponds to the second coding rate. Also, the first coding rate is higher than the second coding rate.

The model matrix of FIG. 22 includes two sub-parity parts 1903 and 1904, wherein the first sub-parity part 1903 corresponding to the first coding rate and the second sub-parity part 1904 corresponding to the second coding rate are connected with each other through one column. In other words, the parity part is arranged in such a manner that the first sub-parity part 1903 and the second sub-parity part 1904 are not disjointed from each other but connected with each other. Namely, the second sub-parity part 1904 is shifted to the left by one column to constitute the parity part. Also, one additional index 1905 is given to generate a parity group $p_{18}$.

An example of a method of applying the IR method using the model matrix of FIG. 22 is as follows. The transmitter performs encoding for information bits $a_0$ to $a_{10}$ through the region 1901. The transmitter generates codewords $a_0, a_1, \ldots, a_{10}, p_0, p_1, \ldots, p_{10}$ through the encoding operation and transmits the generated codewords to the receiver. The receiver decodes the codewords and determines ACK/NACK.

If the transmitter receives NACK, the transmitter performs retransmission. In other words, the transmitter again performs encoding for the information bits $a_0$ to $a_{10}$ through the region 1902. If encoding is performed through the region 1902, parity bits of the parity groups $p_0$ to $p_{18}$ are generated, and the region 1903 and the region 1904 attend to calculation. The weight location in the region 1903 does not overlap the weight location in the region 1904 in a row direction. In this case, the initially generated parity groups $p_0$ to $p_{10}$ have the same values as those of the secondly generated parity groups $p_0$ to $p_{10}$. Accordingly, the transmitter retransmits the parity bits of the parity groups $p_{11}$ to $p_{18}$ to the receiver.

The model matrix of FIG. 22 solves the problem of message passing occurring in the model matrix of FIG. 20. In case of the model matrix of FIG. 20, it is known that error floors occur during decoding. The matrix of FIG. 22 solves the problem of error floors. Also, in case of the model matrix of FIG. 21, since there is no connection node between the sub-parity parts 1803 and 1804, the problem of performance deterioration occurs. In case of the matrix of FIG. 22, since the sub-parity parts 1903 and 1904 are connected with each other, the problem of performance deterioration can be solved.

Figure 23:
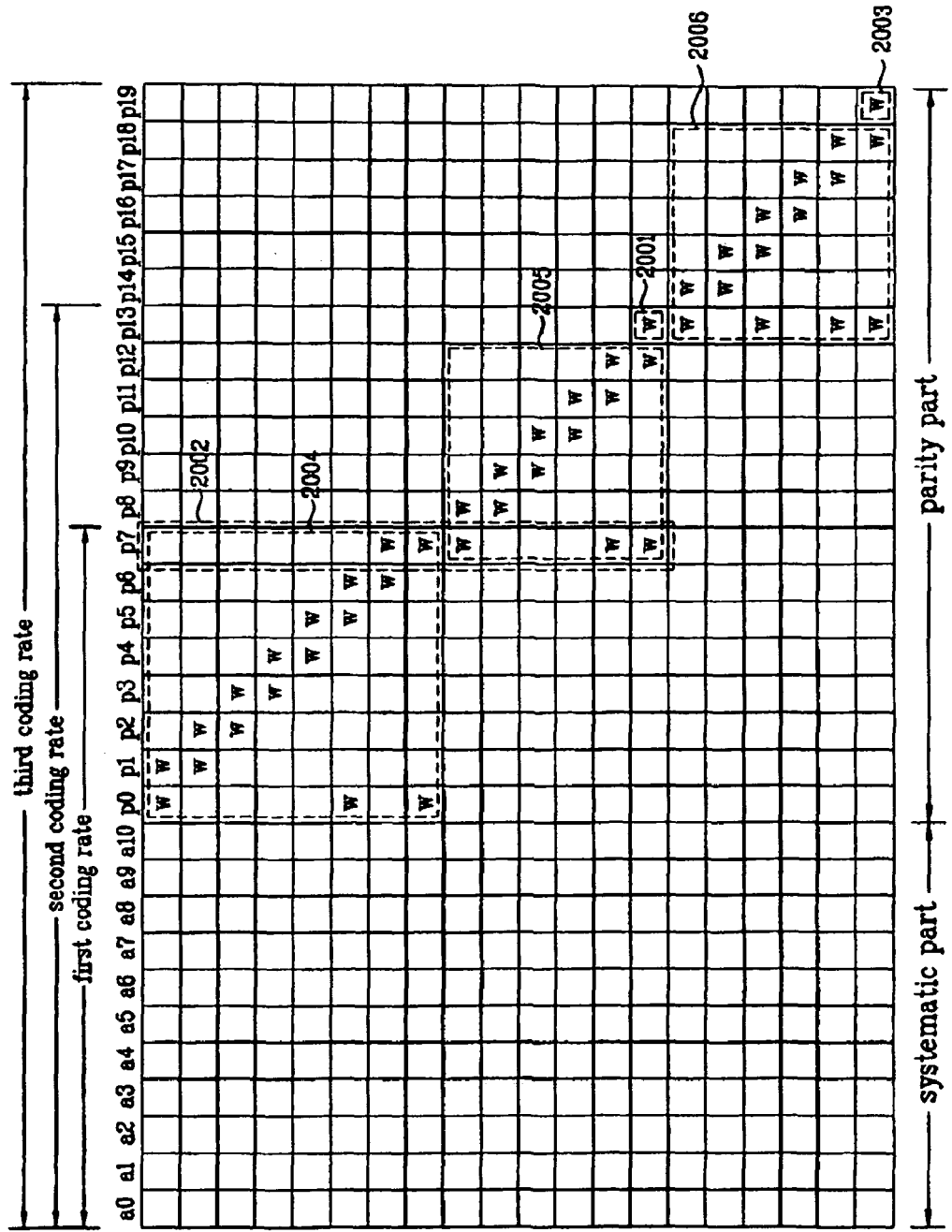
FIG. 23 to FIG. 26 illustrate examples of a model matrix suggested in accordance with the embodiment of the present invention.

FIG. 23 illustrates an example of a model matrix suggested in the embodiment of the present invention. The model matrix of FIG. 23 supports three different coding rates. The parity part of FIG. 23 can be configured by using sub-parity parts 2004, 2005 and 2006 of a structure adopted in the IEEE 802.16c standard. Also, if the sub-parity parts 2004 to 2006 are arranged, the first sub-parity part 2004 corresponding to the first coding rate and the second sub-parity part 2005 corresponding to the second coding rate are connected with each other thorough one column 2002. Preferably, the first coding rate is the highest coding rate which is supported by the model matrix.

If the second sub-parity part 2005 corresponding to the second coding rate and the third sub-parity part 2006 corresponding to the third coding rate are arranged, it is preferable that a node which connects the second sub-parity part 2005 with the third sub-parity part 2006 is additionally provided. In other words, it is preferable that a correlative node or a correlative parity node which generates correlation between two sub-parity parts is additionally provided. The correlative node or the correlative parity node means a node which connects the sub-parity parts having no connection. The correlative node can be generated by giving index of 2001. The index of 2001 which serves as the correlative node connects the second sub-parity part 2005 with the third sub-parity part 2006 to prevent performance from being deteriorated. As described above with reference to the Equation 5, the parity part of the model matrix generally has a square shape. To allow the parity part of the model matrix of FIG. 23 to have a square shape, it is preferable that index is added to the region 2003 of FIG. 23 to generate a parity group $p_0$.

Figure 24:
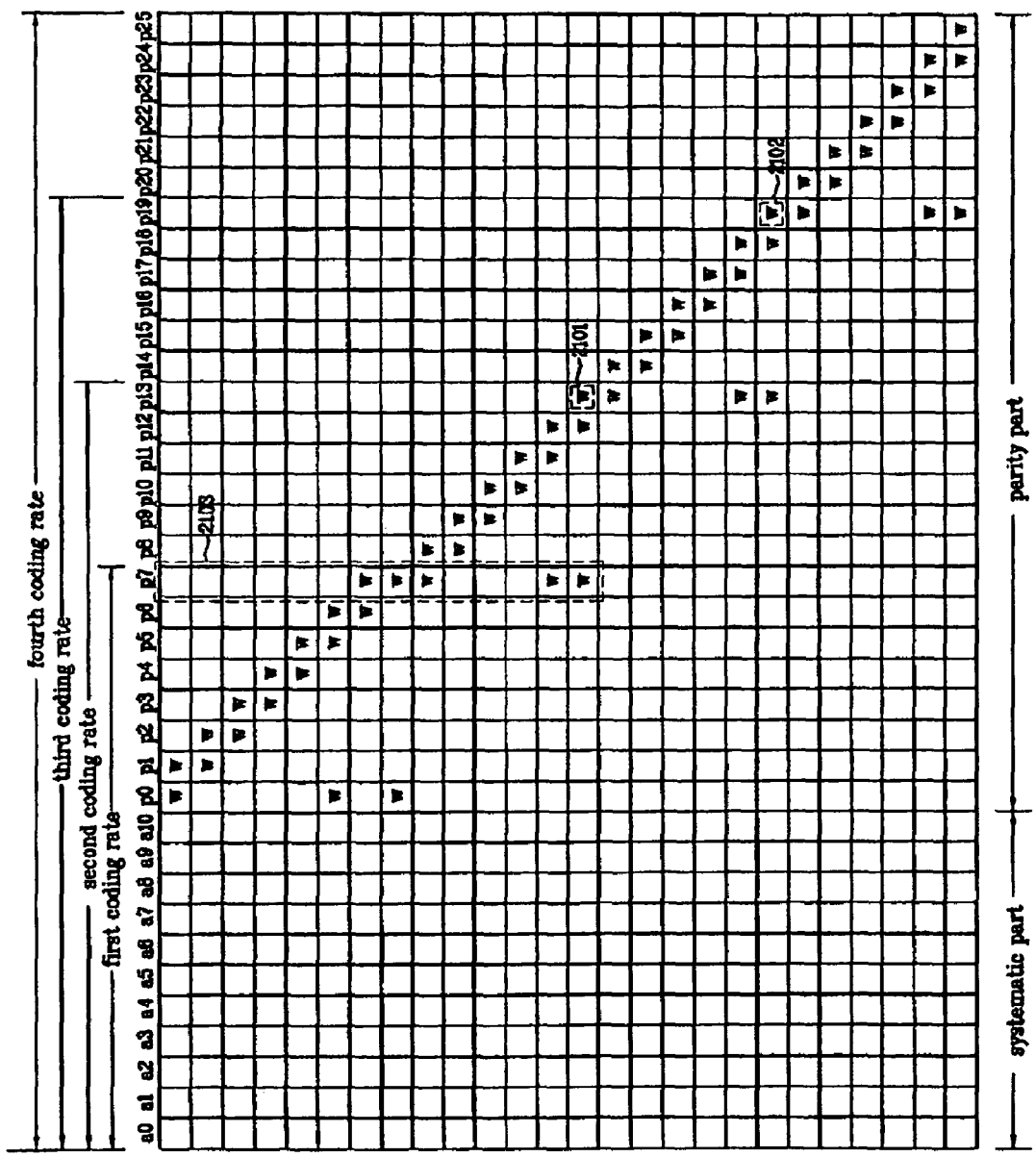

FIG. 24 illustrates an example of a model matrix according to the embodiment of the present invention. The model matrix of FIG. 24 supports four different coding rates. The parity part of FIG. 24 can be configured by combination of the sub-parity parts of which performance has been verified. In other words, the parity part of FIG. 24 can be configured by combination of the parity parts of FIG. 12. In this case, it is preferable that the sub-parity part corresponding to the first coding rate which is the highest and the sub-parity part corresponding to the second coding rate which is the second highest are connected with each other through one column 2103. Since the sub-parity part corresponding to the first coding rate and the sub-parity part corresponding to the second coding rate are connected with each other thorough one column 2103, it is not necessary to additionally provide the correlative node. However, since it is necessary to provide a node which connects the sub-parity part corresponding to the second coding rate with the sub-parity part corresponding to the third coding rate, it is preferable to add a correlative node 2101. Also, it is preferable to add a correlative node 2012 which connects the sub-parity part corresponding to the third coding rate with the sub-parity part corresponding to the fourth coding rate.

As described above, the parity part of the model matrix according to the embodiment of the present invention can be configured by combination of the sub-parity parts of which performance has been verified. However, since this configuration is for convenience of description, the present invention is not limited to such configuration. In other words, the parity part according to the embodiment of the present invention can be designed by various methods in addition to combination of a specific number of parity parts.

Hereinafter, various methods for configuring a model matrix in accordance with the embodiment of the present invention will be described.

Figure 25:
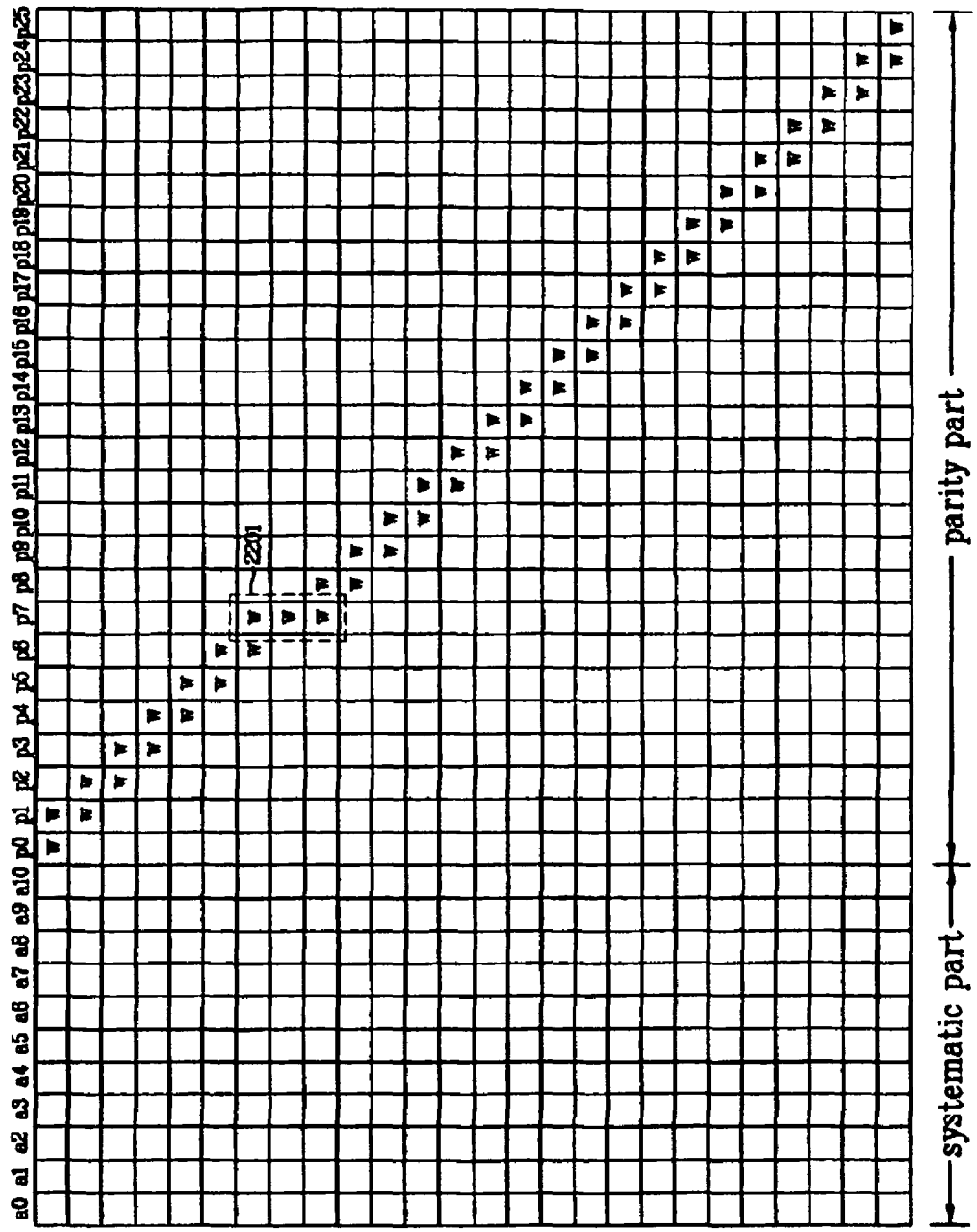

FIG. 25 illustrates another example of the model matrix according to the embodiment of the present invention. The model matrix according to the embodiment of the present invention is characterized in that the parity part has twisted dual diagonal elements. Although the parity part of FIG. 11 or FIG. 14 has dual diagonal elements which are not twisted, the model matrix of FIG. 25 has a twisted structure.

In other words, the parity part of the model matrix according to this embodiment has diagonal elements and their adjacent diagonal elements. In this case, the adjacent diagonal elements may be located above the diagonal elements in some regions and may be located below the diagonal elements in the other regions.

A region 2201 of FIG. 25 represents a point where dual diagonal elements are twisted. The adjacent elements are located above the diagonal elements at the left of the region 2201 while they are located below the diagonal elements at the right of the region 2201. In other words, the dual diagonal elements are designed in accordance with the aforementioned upper triangle type at the left of the region 2201 while the dual diagonal elements are designed in accordance with the aforementioned lower triangle type at the right of the region 2201.

Figure 26:
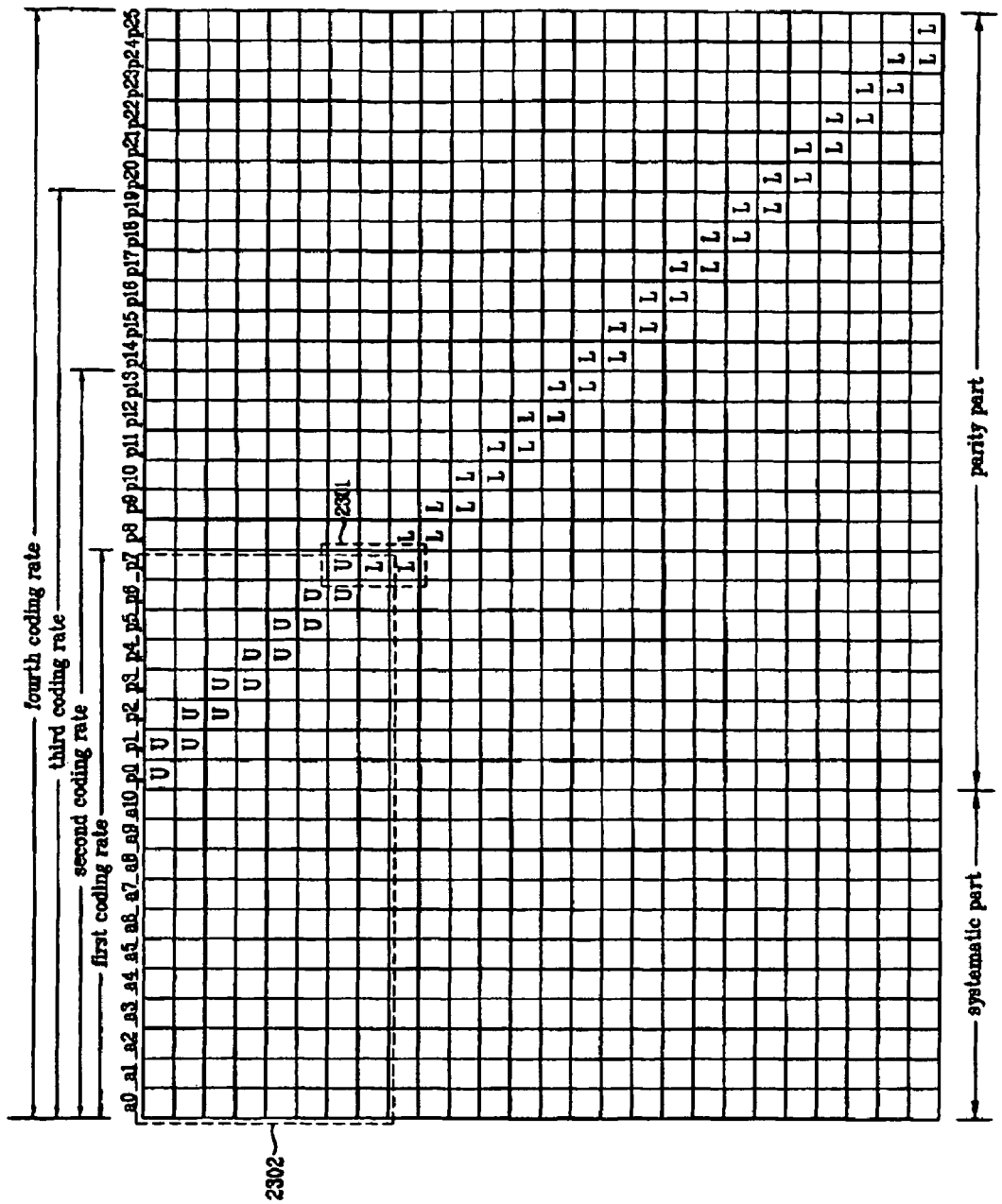

The aforementioned structure can be expressed by FIG. 26. In FIG. 26, 'U' represents dual diagonal elements according to the upper triangle type, and 'L' represents dual diagonal elements according to the lower triangle type. As shown, the matrix of FIG. 26 includes different kinds of dual diagonal elements based on a region 2301. In other words, the matrix of FIG. 26 is characterized in twisted dual diagonal elements.

The region 2301 is preferably determined in accordance with the region corresponding to the highest coding rate supported by the model matrix. For example, if the highest coding rate supported by the model matrix of FIG. 26 corresponds to a region 2302, the region 2301 is preferably determined as a point where twist starts. In other words, it is preferable that the parity part of the region which supports the highest coding rate is designed in accordance with the upper triangle type while the parity part of the other regions is designed in accordance with the lower triangle type or the accumulator structure.

As described above, classification of the upper triangle type and the lower triangle type is classification of the dual diagonal elements. Accordingly, regions other than regions where the dual diagonal elements are located have free indexes (i.e., shift numbers). In other words, like the model matrix of FIG. 26, the elements other than the dual diagonal elements may have indexes of '−1' or random elements.

Figure 27:
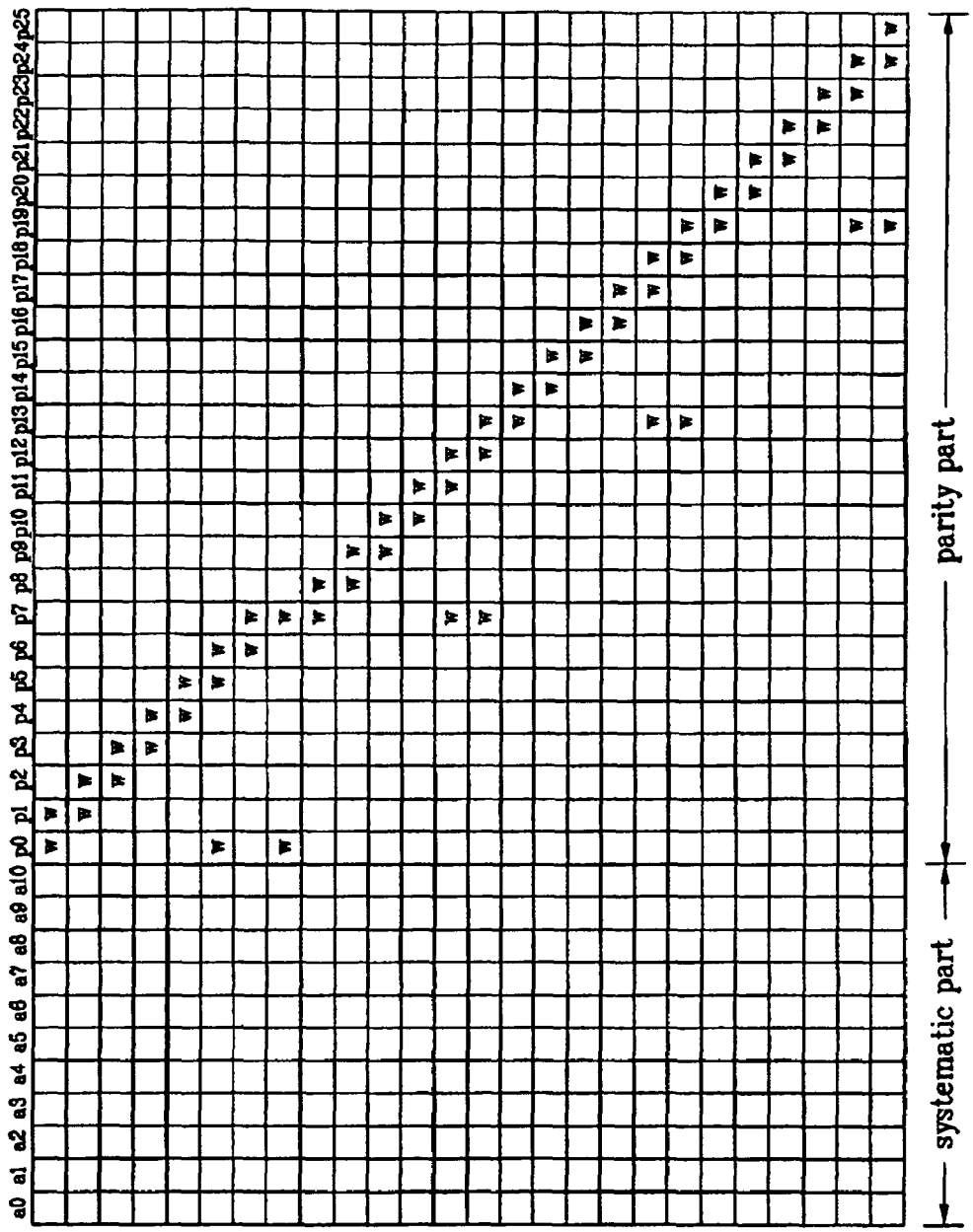
FIG. 27 illustrates an example of a model matrix which includes a parity part having twisted dual diagonal elements and other random elements in accordance with embodiment of the present invention.

FIG. 27 illustrates an example of a model matrix which includes a parity part having twisted dual diagonal elements and other elements in accordance with embodiment of the present invention. In case of FIG. 27, twist occurs in a column corresponding to the parity group $p_7$. Also, as described above, it is preferable that the region where twist occurs is a region which supports the highest coding rate. The region where twist occurs may be formed freely. If twist occurs as shown in FIG. 27, the model matrix of FIG. 27 becomes the same model matrix as that of FIG. 24.

In short, the model matrix according to the embodiment of the present invention may be generated in such a manner that random matrixes of which performance has been verified are combined with each other and connected with each other through one row or a specific correlative parity node. Also, the model matrix according to the embodiment of the present invention may be generated using the twisted dual diagonal elements.

Figure 28:
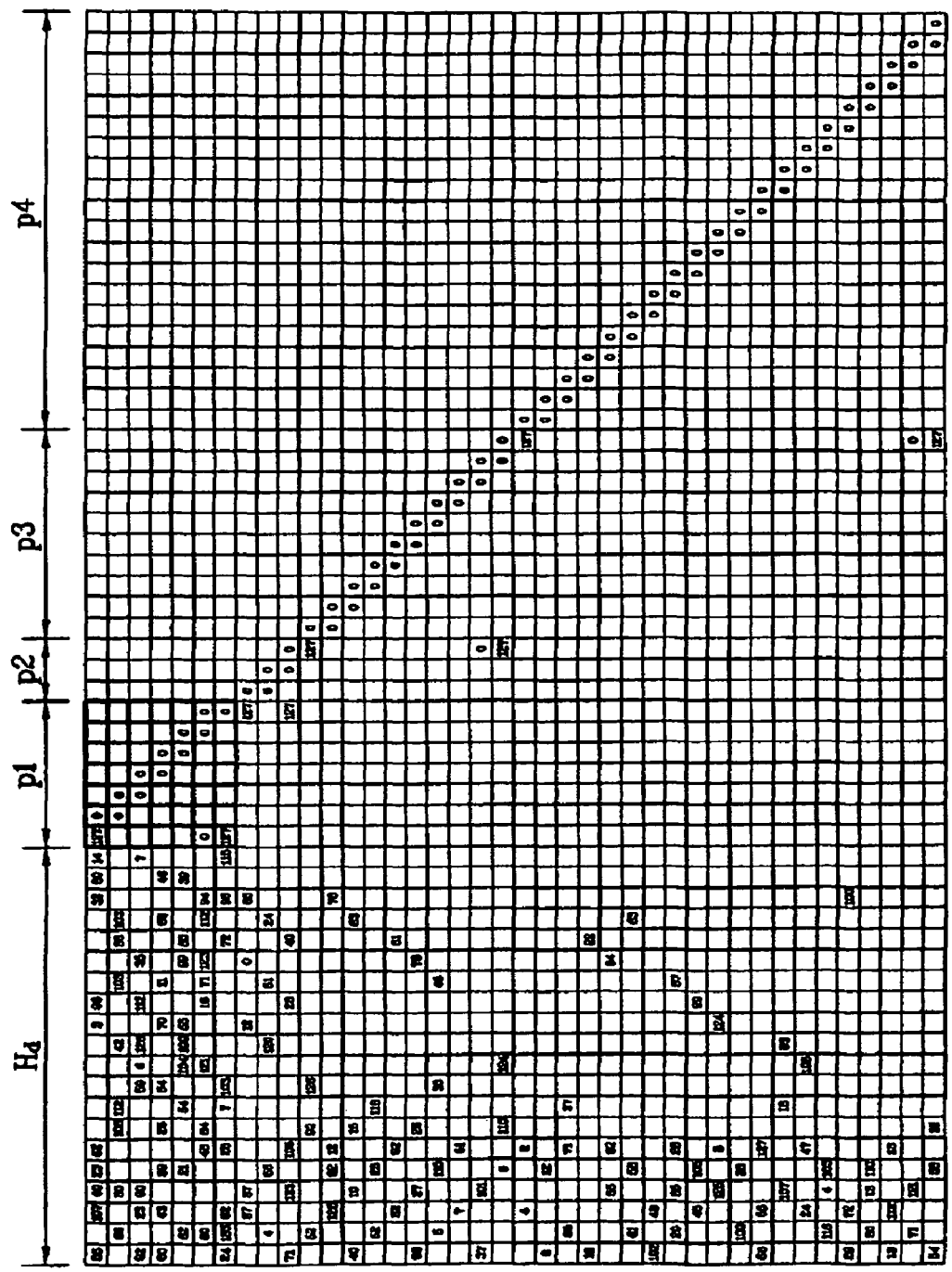
FIG. 28 illustrates another example of a model matrix according to the embodiment of the present invention.

FIG. 28 illustrates another example of the model matrix according to the embodiment of the present invention. The model matrix of FIG. 28 has been designed to support four coding rates. If the model matrix of FIG. 28 is used, the IR method can be supported in accordance with the four coding rates. In FIG. 28, sub-blocks marked with '0' mean identity matrixes, and sub-blocks marked with integers greater than 1 mean permutation matrixes generated by shifting each row or column of the identity matrixes in a certain direction by corresponding index. Sub-blocks marked with nothing mean zero matrixes.

Hereinafter, the encoding method using the model matrix of FIG. 28 will be described.

Figure 29:
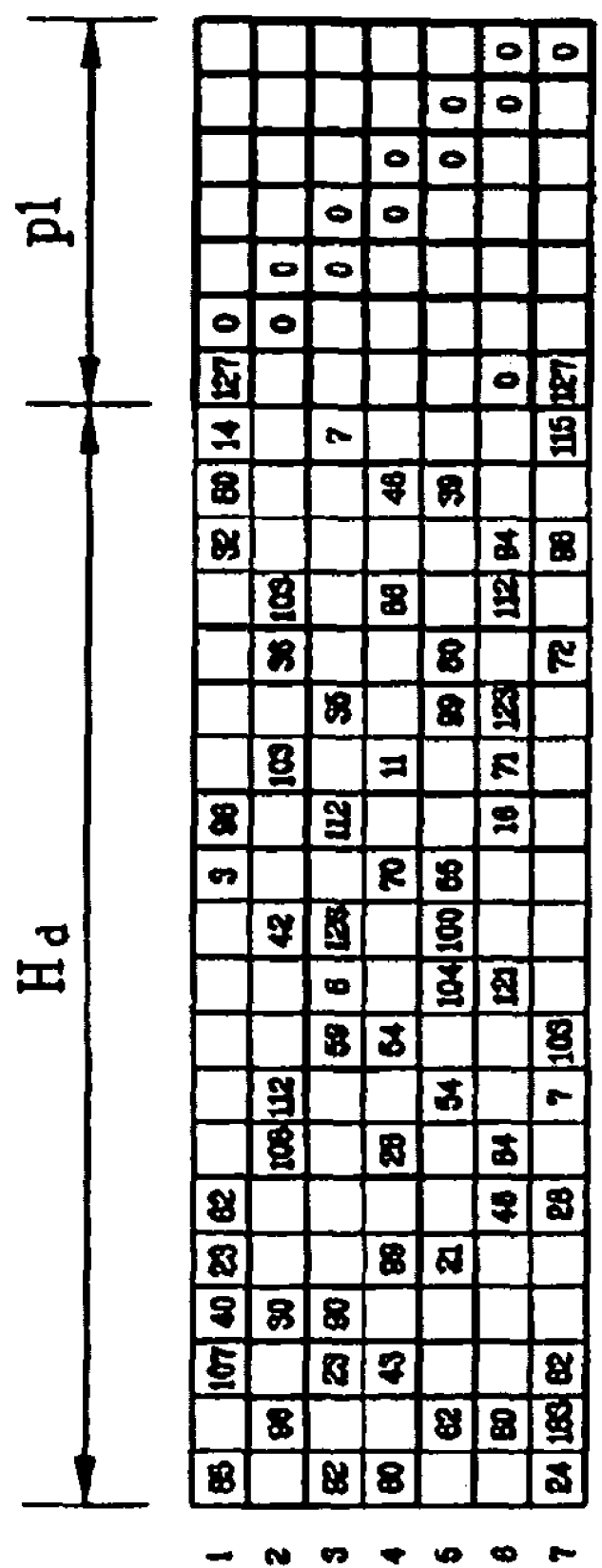
FIG. 29 illustrates an example of a model matrix used when initial data are transmitted in accordance with the embodiment of the present invention.

FIG. 29 illustrates a part of a model matrix used in case of new data packet transmission. First of all, the transmitter performs encoding at a first coding rate ($20/27$) by using the matrix of FIG. 29 and transmits information bits and parity bits of the parity group $p_1$ to the receiver.

Figure 30:
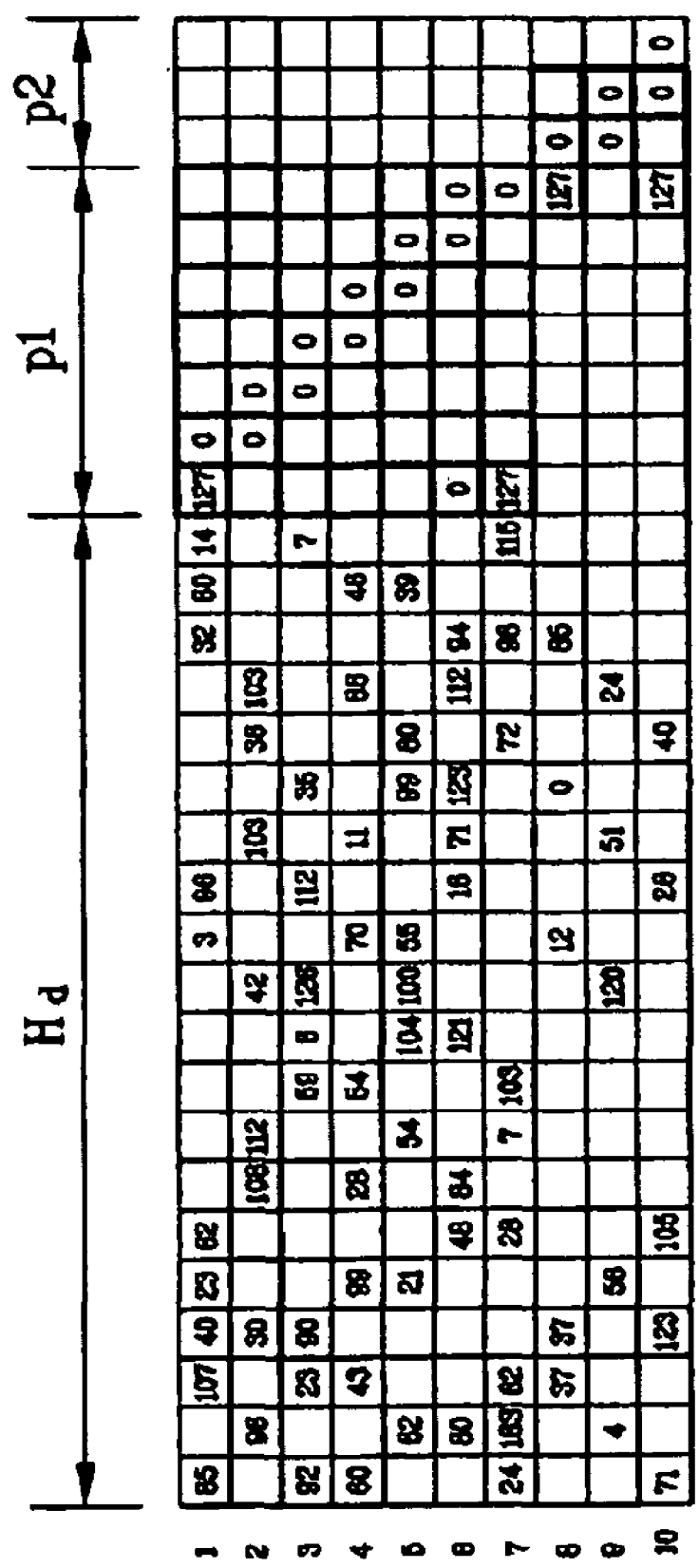
FIG. 30 illustrates an example of a model matrix used for first retransmission in accordance with the embodiment of the present invention.

FIG. 30 illustrates another part of a model matrix used in case of first retransmission. The matrix of FIG. 30 is used if NACK is received in response to a transmitting signal encoded by the matrix of FIG. 29. The transmitter which has received NACK again performs encoding at a second coding rate ($2/3$), and transmits parity bits of the additionally generated parity group $p_2$ to the receiver.

Figure 31:
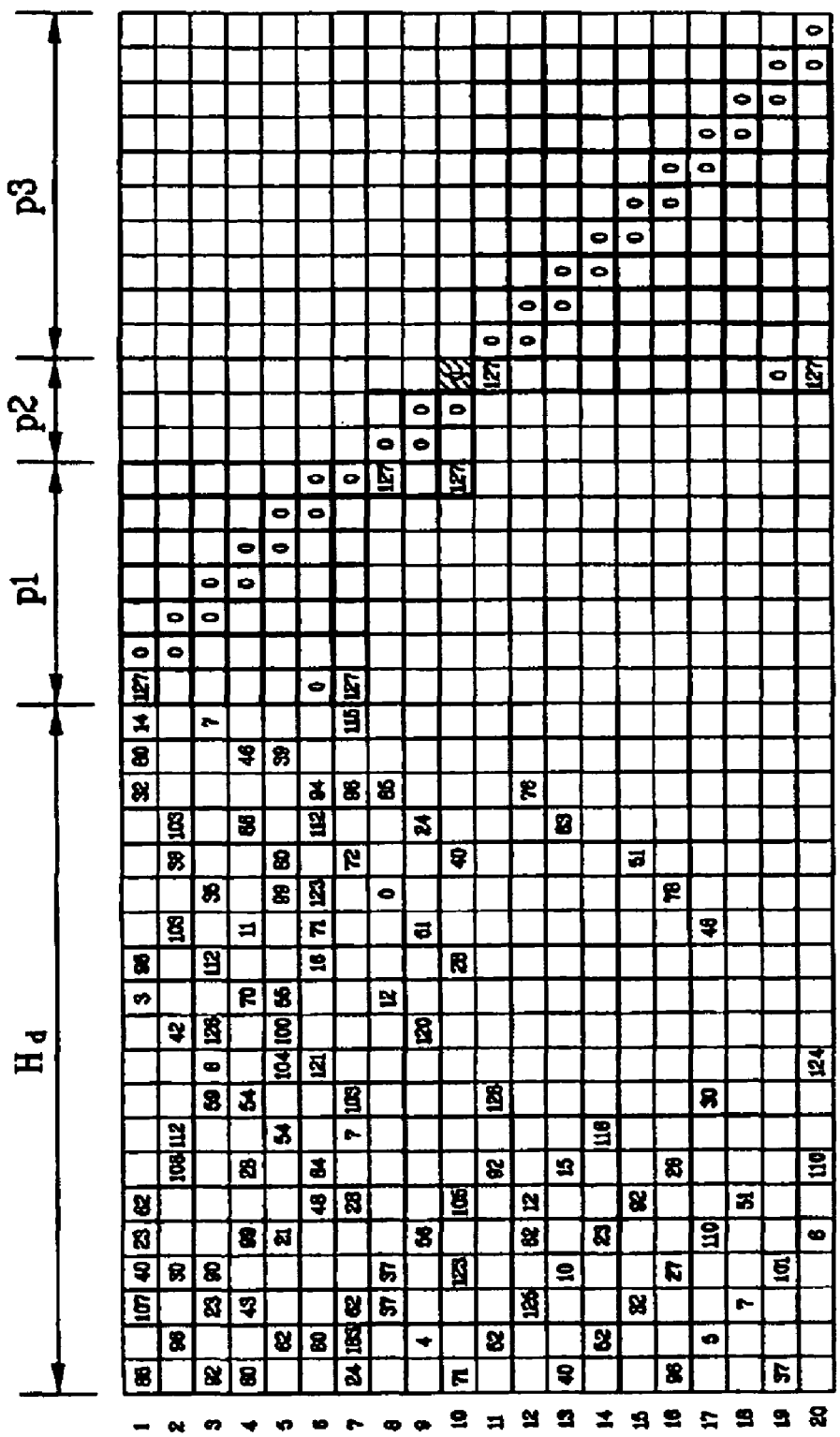
FIG. 31 illustrates an example of a model matrix used for second retransmission in accordance with the embodiment of the present invention.

FIG. 31 illustrates another part of a model matrix used in case of second retransmission. The matrix of FIG. 31 is used if NACK is received in response to a transmitting signal encoded by the matrix of FIG. 30. The transmitter which has received NACK again performs encoding at a third coding rate ($1/2$), and transmits parity bits of the additionally generated parity group $p_3$ to the receiver.

Figure 32:
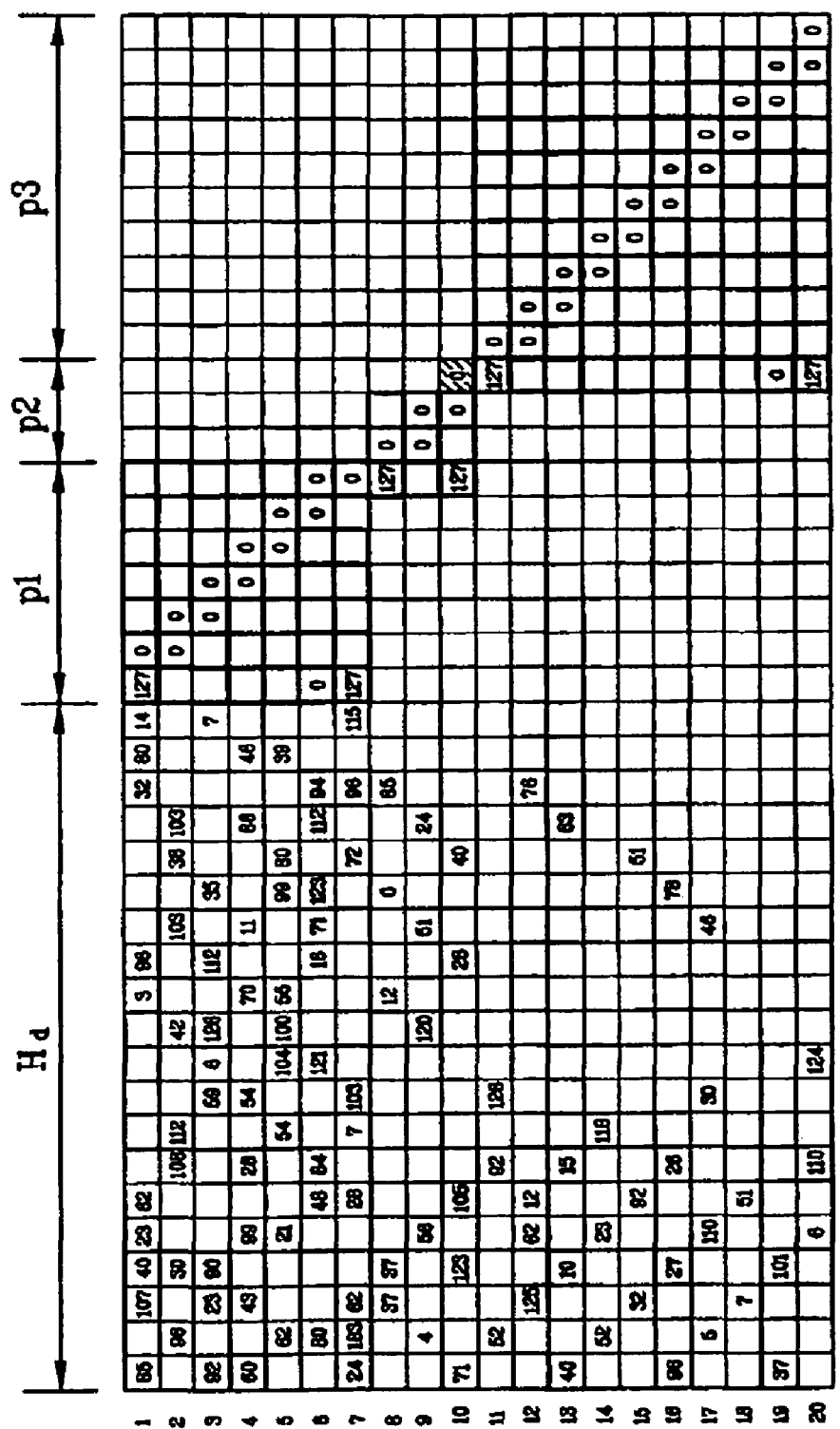
FIG. 32 illustrates an example of a model matrix used for third retransmission in accordance with the embodiment of the present invention.

FIG. 32 illustrates another part of a model matrix used in case of third retransmission. The matrix of FIG. 32 is used if NACK is received in response to a transmitting signal encoded by the matrix of FIG. 31. The transmitter which has received NACK again performs encoding at a fourth coding rate ($1/3$), and transmits parity bits of the additionally generated parity group $p_4$ to the receiver.

Since the example of the aforementioned IR method is to describe the embodiment of the present invention, the present invention is not limited to the aforementioned numerical values or the aforementioned order. In other words, data transmission and reception may first be performed at the second coding rate or the third coding rate and then may be performed at a higher coding rate later. Also, data transmission and reception may be performed without a specific coding rate.

If the model matrix according to the aforementioned embodiments of the present invention is used, the following advantages can be obtained.

First, the IR method can be supported. According to the embodiment of the present invention, since specific parity bits are equal to one another even though the coding rate is lowered, additional parity bits can only be transmitted, whereby data transmission and reception can be performed desirably.

Also, according to one embodiment of the present invention, the problem of error floors can be solved. If the lower triangle type matrix is used to support the IR method, error floors may occur in case of the high coding rate. However, according to another embodiment of the present invention, the parity part according to the first coding rate is designed in accordance with the upper triangle type to solve the problem of error floors. Moreover, the problem of error floors occurring in case of the low coding rate can be solved by transmitting additional parity bits, i.e., redundant bits to the data of the high coding rate.

Figure 33:
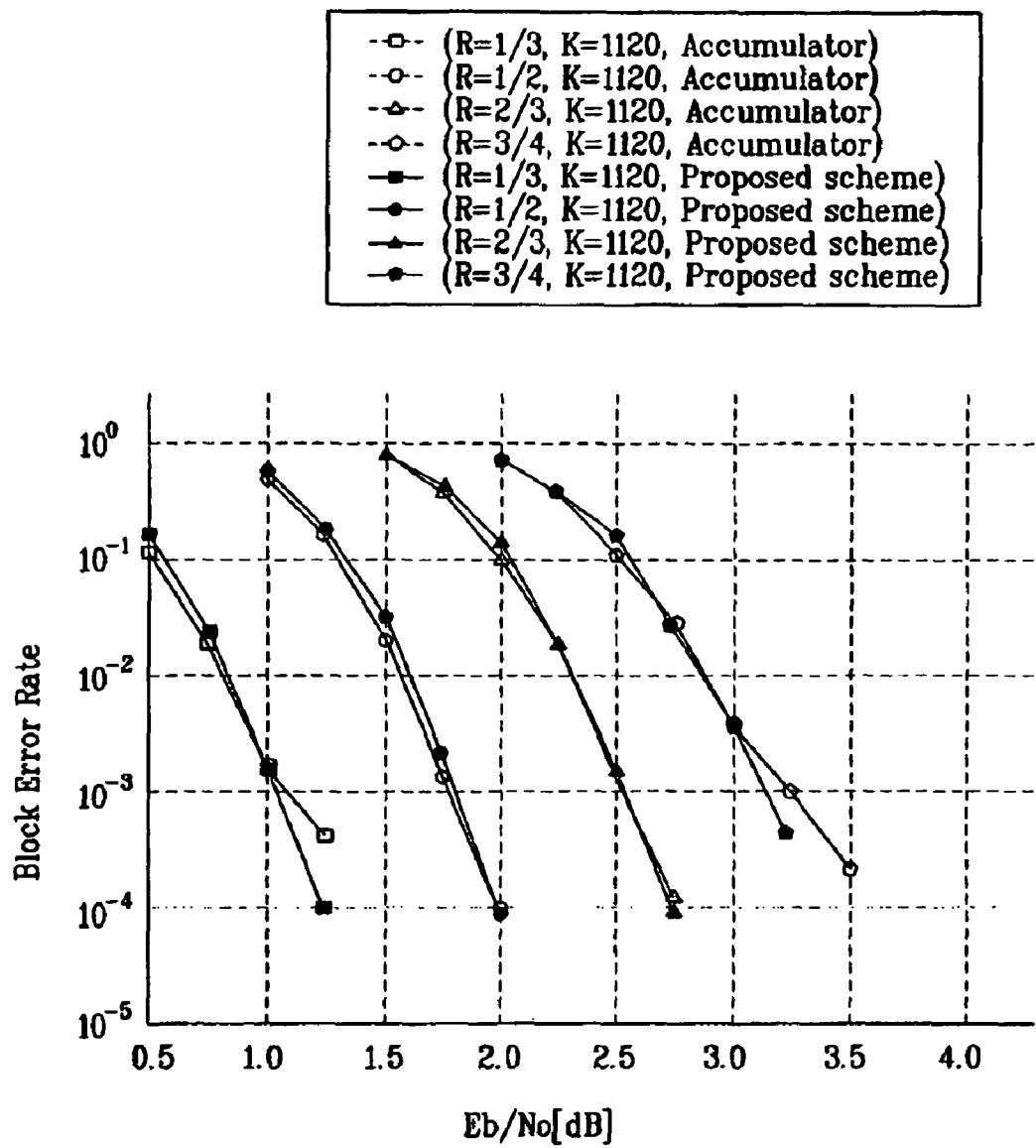
FIG. 33 illustrates comparison between performance of a model matrix having an accumulator structure and performance of a model matrix of FIG. 28.

FIG. 33 illustrates comparison between performance of the model matrix having the lower triangle type and performance of the model matrix of FIG. 27. As shown, in the model matrix of the lower triangle type (or accumulator structure), error floors are observed, in which BER is not reduced even in case of high Eb/No status. However, in case of the model matrix of FIG. 24, it is noted that BER is reduced as Eb/No increases. In other words, the problem of error floors is solved.

Figure 34:
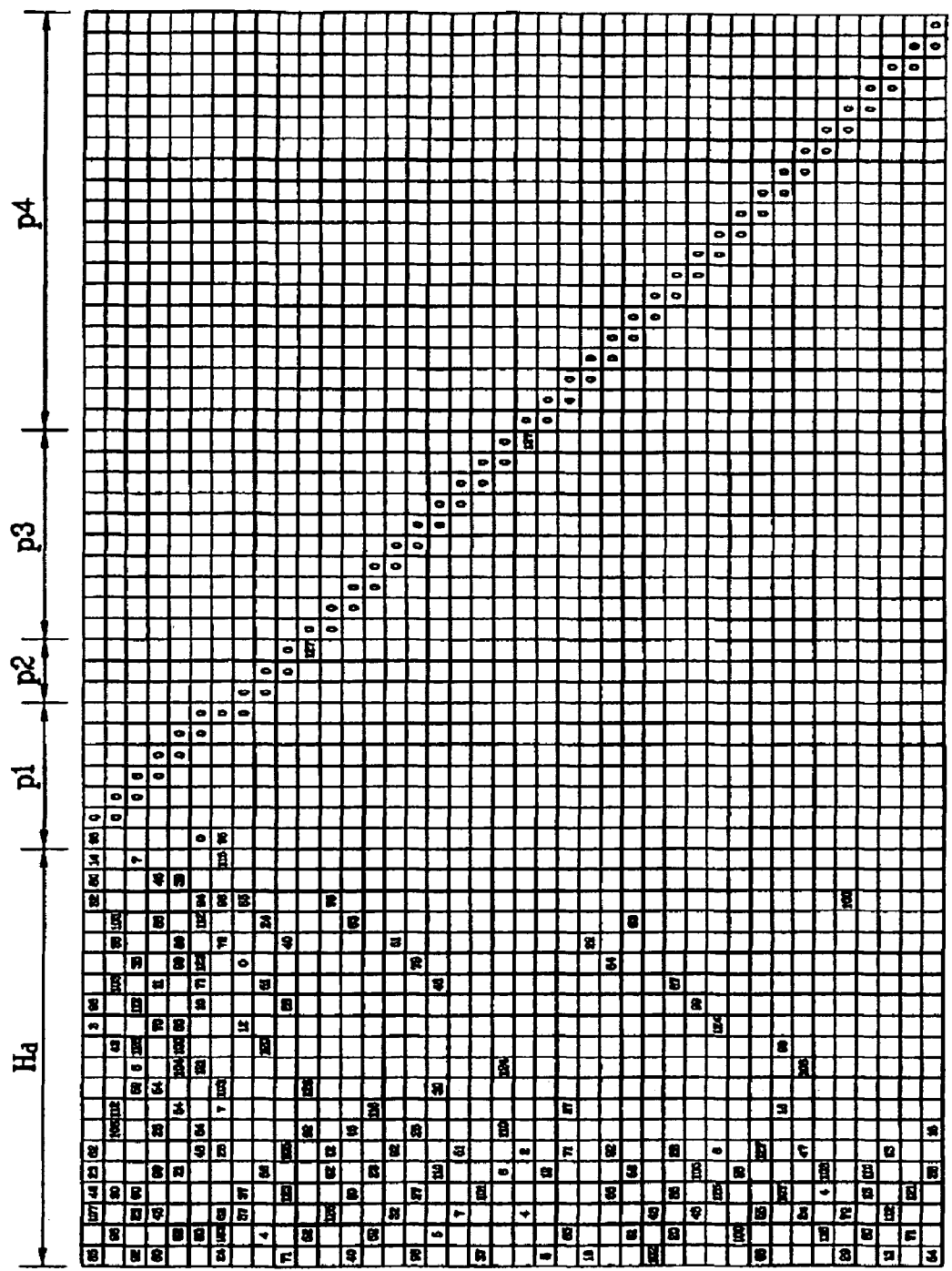
FIG. 34 to FIG. 36 illustrate another examples of a model matrix according to the embodiment of the present invention.

FIG. 34 illustrates another example of the model matrix according to another embodiment of the present invention. The embodiment of FIG. 34 illustrates a model matrix which supports four different coding rates. As shown, the parity part which supports the first coding rate which is the highest includes dual diagonal elements according to the upper triangle type. Also, the parity part which supports the second coding rate lower than the first coding rate includes dual diagonal elements according to the lower triangle type.

As described above, the model matrix according to the embodiment of the present invention has random indexes as dual diagonal elements. Also, the model matrix has random indexes in regions other than the dual diagonal elements. FIG. 34 illustrates an example of the model matrix having various indexes.

Figure 35:
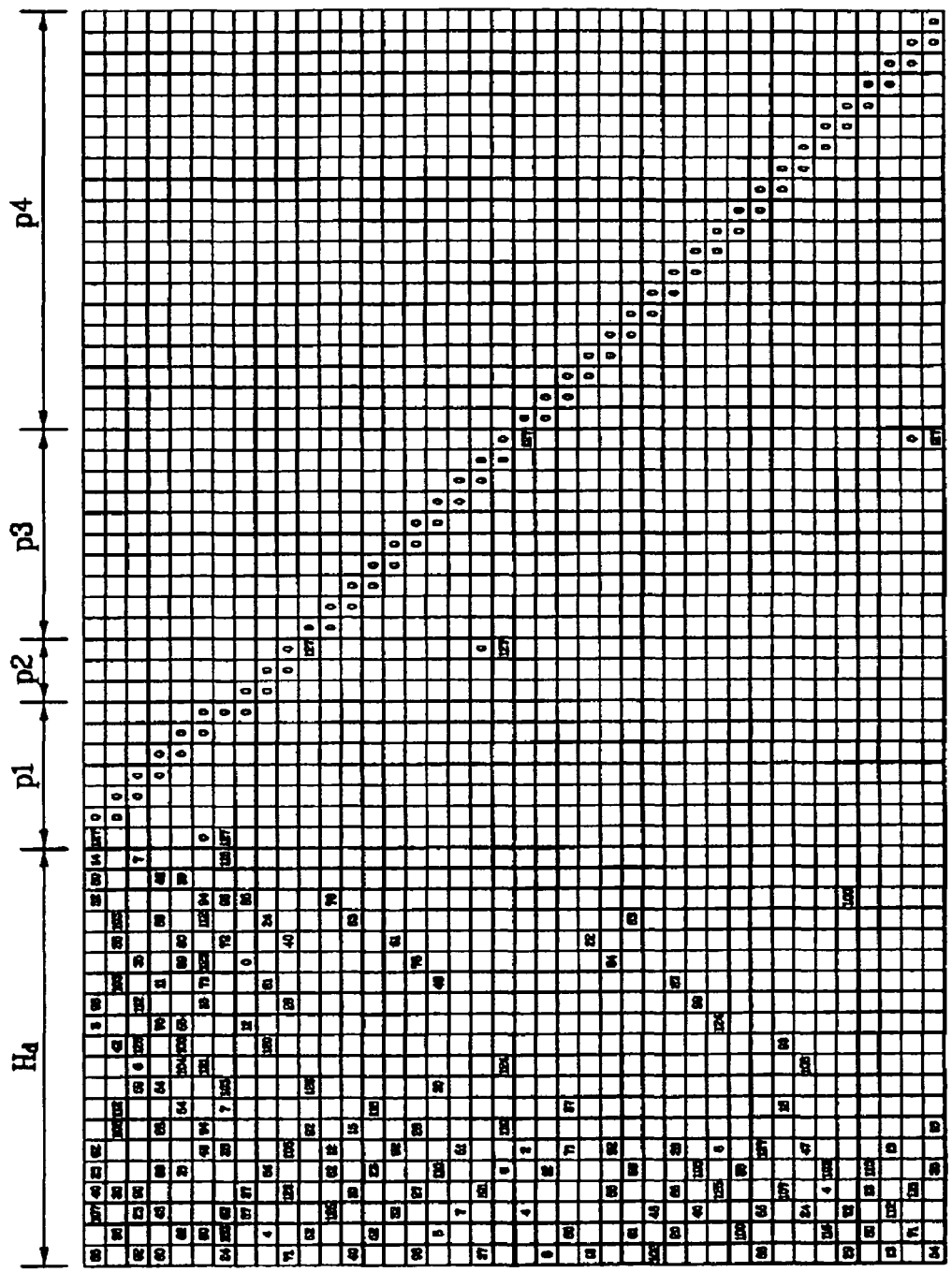

FIG. 35 illustrates another example of the model matrix according to the embodiment of the present invention. As shown in FIG. 35, the matrix of FIG. 35 includes twisted dual diagonal elements. Also, the matrix of FIG. 35 has various indexes at the location of the dual diagonal elements. A point where the dual diagonal elements are twisted becomes a boundary point between the first coding rate and the second coding rate.

Figure 36:
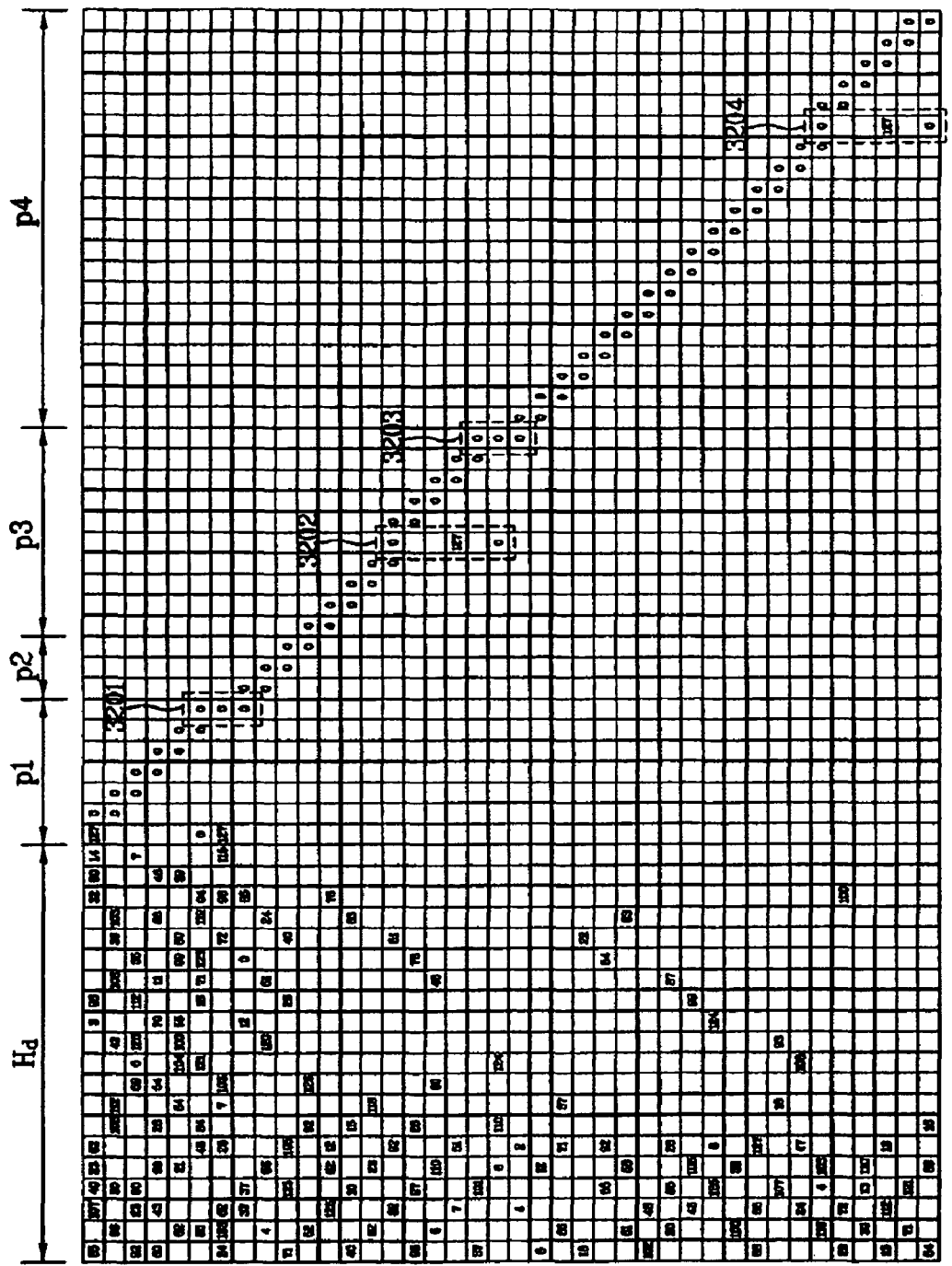

FIG. 36 illustrates another example of the model matrix according to the embodiment of the present invention. As shown in FIG. 36, the matrix of FIG. 36 includes twisted dual diagonal elements. Also, the matrix of FIG. 36 has various indexes at the location of the dual diagonal elements. Although the model matrix of FIG. 35 is characterized in that the dual diagonal elements are twisted at the boundary point between the first coding rate and the second coding rate, the model matrix of FIG. 36 is characterized in that the dual diagonal elements are twisted at several points. As shown, twist occurs in a sub-parity part 3201 corresponding to the first coding rate, sub-parity parts 3202 and 3203 corresponding to the third coding rate, and a sub-parity part 3204 corresponding to the fourth coding rate. According to the embodiment of the present invention, twist of the dual diagonal elements may occur in random locations. In this case, the IR method which supports various coding rates can be performed.

Since the aforementioned coding rates, the size of the matrix, and weight features are only exemplary to describe the present invention, the present invention is not limited to the aforementioned numerical values. In other words, the conditions such as the coding rates can freely be changed.

According to the present invention, the IR method can be supported. Also, since specific parity bits are equal to one another even though the coding rate is lowered, additional parity bits can only be transmitted, whereby data transmission and reception can be performed desirably. Moreover, according to the embodiment of the present invention, the problem of error floors can be solved.

It will be apparent to those skilled in the art that the present invention can be embodied in other specific forms without departing from the spirit and essential characteristics of the invention. Thus, the above embodiments are to be considered in all respects as, illustrative and not restrictive. The scope of the invention should be determined by reasonable interpretation of the appended claims and all change which comes within the equivalent scope of the invention are included in the scope of the invention.

INDUSTRIAL APPLICABILITY

The present invention can be applied to every field where encoding and decoding are used, as well as a wireless communication system such as a mobile communication system or a wireless Internet system.

The invention claimed is:

1. A method of encoding data using a parity check matrix, the method comprising:

encoding a first input data stream using a first sub-matrix of a parity check matrix including at least two sub-matrixes; and encoding a second input data stream using a second sub-matrix of the parity check matrix, wherein a first sub-parity part of the first sub-matrix and a second sub-parity part of the second sub-matrix have a dual diagonal structure, and each column weight of the first sub-parity part and the second sub-parity part is greater than at least 2.

2. The method of claim 1, wherein the first sub-matrix or the second sub-matrix includes the second sub-matrix or the first sub-matrix, respectively.

3. The method of claim 1, wherein the at least two sub-matrixes correspond to different coding rates.

4. The method of claim 3, wherein a sub-matrix corresponding to a lower coding rate includes a sub-matrix corresponding to a higher coding rate.

5. The method of claim 1, wherein the first sub-parity part is an upper triangle type, and the second sub-parity part is a lower triangle type.

6. The method of claim 1, wherein the first sub-parity part is a lower triangle type, and the second sub-parity part is an upper triangle type.

7. The method of claim 1, wherein the second sub-parity part is shifted by one column based on the first sub-parity part.

8. The method of claim 1, wherein the first sub-parity part and the second sub-parity part are connected with each other through one column.

9. The method of claim 1, wherein the parity check matrix has a twisted dual diagonal structure.

10. A method of retransmitting data in a mobile communication system, the data retransmission method comprising:

transmitting a first data packet encoded by a first sub-matrix of a parity check matrix to a receiving side, the parity check matrix including at least two sub-matrixes;

receiving a retransmission request message for the first data packet from the receiving side; and transmitting a second data packet encoded by a second sub-matrix of the parity check matrix to the receiving side, wherein a first sub-parity part of the first sub-matrix and a second sub-parity part of the second sub-matrix have a dual diagonal structure, and each column weight of the first sub-parity part and the second sub-parity part is greater than at least 2.

11. The method of claim 10, wherein the first sub-parity part is an upper triangle type, and the second sub-parity part is a lower triangle type.

12. The method of claim 10, wherein the first sub-parity part is a lower triangle type, and the second sub-parity part is an upper triangle type.

13. The method of claim 10, wherein the second sub-parity part is shifted by one column based on the first sub-parity part.

14. The method of claim 10, wherein the first sub-parity part and the second sub-parity part are connected with each other through one column.

15. The method of claim 10, wherein the parity check matrix has a twisted dual diagonal structure.

16. A method of encoding data using a parity check matrix, the method comprising:
- encoding a first input data stream using a first sub-matrix of a parity check matrix including at least two sub-matrixes; and
- encoding a second input data stream using a second sub-matrix of the parity check matrix,
- wherein a first sub-parity part of the first sub-matrix and a second sub-parity part of the second sub-matrix have a dual diagonal structure.

* * * * *